(12) United States Patent
Nakamura

(10) Patent No.: US 12,148,743 B2
(45) Date of Patent: Nov. 19, 2024

(54) SEMICONDUCTOR DEVICE AND ELECTRONIC EQUIPMENT

(71) Applicant: SONY SEMICONDUCTOR SOLUTIONS CORPORATION, Kanagawa (JP)

(72) Inventor: Takuya Nakamura, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 438 days.

(21) Appl. No.: 17/299,058

(22) PCT Filed: Dec. 10, 2019

(86) PCT No.: PCT/JP2019/048176
§ 371 (c)(1),
(2) Date: Jun. 2, 2021

(87) PCT Pub. No.: WO2020/122037
PCT Pub. Date: Jun. 18, 2020

(65) Prior Publication Data
US 2022/0037300 A1     Feb. 3, 2022

(30) Foreign Application Priority Data
Dec. 11, 2018 (JP) .................. 2018-231852

(51) Int. Cl.
*H01L 25/16* (2023.01)
*H01L 23/48* (2006.01)
(Continued)

(52) U.S. Cl.
CPC .......... *H01L 25/167* (2013.01); *H01L 23/481* (2013.01); *H01L 33/44* (2013.01); *H01L 33/62* (2013.01); *H01L 33/64* (2013.01)

(58) Field of Classification Search
CPC ..... H01L 25/167; H01L 23/481; H01L 33/44; H01L 33/62; H01L 33/64; H01L 25/0753; G09F 9/33
See application file for complete search history.

(56) References Cited

U.S. PATENT DOCUMENTS 10,134,709 B1 * 11/2018 Wu ........................ H01L 33/502
2007/0145393 A1 * 6/2007 Darbinian ............. H01L 33/483
257/E25.02
(Continued)

FOREIGN PATENT DOCUMENTS

| CN | 102737578 A | 10/2012 |
|----|-------------|---------|
| CN | 105324858 A | 2/2016  |

(Continued)

OTHER PUBLICATIONS

International Search Report and Written Opinion of PCT Application No. PCT/JP2019/048176, issued on Mar. 17, 2020, 08 pages of ISRWO.

*Primary Examiner* — Galina G Yushina
(74) *Attorney, Agent, or Firm* — CHIP LAW GROUP

(57) ABSTRACT

Provided is a semiconductor device including a drive circuit which is provided on one surface of a semiconductor substrate and drives a light emitting element, one of or a plurality of the light emitting elements which is provided on another surface of the semiconductor substrate, and a through electrode which penetrates the semiconductor substrate and electrically connects the drive circuit with the light emitting element.

9 Claims, 19 Drawing Sheets

(51) Int. Cl.
*H01L 33/44* (2010.01)
*H01L 33/62* (2010.01)
*H01L 33/64* (2010.01)

(56) References Cited

U.S. PATENT DOCUMENTS

| | | | |
|---|---|---|---|
| 2010/0096659 A1* | 4/2010 | Noma | H01L 33/486 |
| | | | 257/E33.001 |
| 2010/0172665 A1* | 7/2010 | Nomura | G03G 15/04045 |
| | | | 399/51 |
| 2012/0062115 A1* | 3/2012 | Song | H01L 25/167 |
| | | | 315/51 |
| 2012/0256814 A1 | 10/2012 | Ootorii | |
| 2014/0367705 A1 | 12/2014 | Bibl et al. | |
| 2016/0111405 A1* | 4/2016 | Bibl | H01L 33/62 |
| | | | 257/13 |
| 2017/0301724 A1* | 10/2017 | Lee | H01L 33/52 |

FOREIGN PATENT DOCUMENTS

| | | |
|---|---|---|
| JP | 2011-233733 A | 11/2011 |
| JP | 2012-227514 A | 11/2012 |
| JP | 2016-522585 A | 7/2016 |
| JP | 2017-139489 A | 8/2017 |
| JP | 2018-124474 A | 8/2018 |
| JP | 2018-141944 A | 9/2018 |
| KR | 10-2016-0010537 A | 1/2016 |
| WO | 2014/204695 A1 | 12/2014 |

\* cited by examiner

SEMICONDUCTOR DEVICE AND ELECTRONIC EQUIPMENT

CROSS REFERENCE TO RELATED APPLICATIONS

This application is a U.S. National Phase of International Patent Application No. PCT/JP2019/048176 filed on Dec. 10, 2019, which claims priority benefit of Japanese Patent Application No. JP 2018-231852 filed in the Japan Patent Office on Dec. 11, 2018. Each of the above-referenced applications is hereby incorporated herein by reference in its entirety.

TECHNICAL FIELD

The present disclosure relates to a semiconductor device and electronic equipment.

BACKGROUND ART

In a display device (semiconductor device) such as a display device using a light emitting diode (LED), a plurality of light emitting elements is arrayed on a substrate in a matrix to constitute a video display surface for displaying a video or the like. In such a display device described above, there is a method by which controlling a plurality of signal lines and a plurality of scan lines which are arranged in a grid pattern drives the plurality of light emitting elements each of which is positioned at an intersection of each signal line and each scan line. In addition, in the display device described above, there is another method by which, in order to perform active driving of light emitting elements for each pixel, one of or a plurality of light emitting elements which is included in one pixel unit is controlled. According to a latter method, it becomes possible to drive light emitting elements of each pixel with higher accuracy. Note that, as one example of such a display device, it is possible to provide a device which is disclosed in PTL 1 described below.

CITATION LIST

Patent Literature

[PTL 1]
JP 2011-233733A

SUMMARY

Technical Problems

In order to perform active driving, however, light emitting elements and a drive circuit which drives the light emitting elements are required to be mounted on one substrate, thereby making it difficult to avoid increase in mounting area. Moreover, as a pixel count included in a display device (semiconductor device) increases more, the number of wires electrically connected between the light emitting elements and the drive circuit increases more, resulting that leading of the wires becomes more complicated according to the increased number of wires. As a result, it is obvious that avoiding increase in mounting area becomes more difficult.

In view of this, the present disclosure proposes one example of a semiconductor device capable of preventing increase in mounting area.

Solution to Problems

According to the present disclosure, there is provided a semiconductor device including a drive circuit that is provided on one surface of a semiconductor substrate and drives a light emitting element, one of or a plurality of the light emitting elements that is provided on another surface of the semiconductor substrate, and a through electrode that penetrates the semiconductor substrate and electrically connects the drive circuit with the light emitting element.

In addition, according to the present disclosure, there is provided electronic equipment including one or a plurality of semiconductor devices including a drive circuit that is provided on one surface of a semiconductor substrate and drives a light emitting element, one of or a plurality of the light emitting elements that is provided on another surface of the semiconductor substrate, and a through electrode that penetrates the semiconductor substrate and electrically connects the drive circuit with the light emitting element.

Advantageous Effect of Invention

As has been described above, according to the present disclosure, it is possible to provide a semiconductor device capable of preventing increase in mounting area.

Note that the above-mentioned effect is not necessarily limited, and any effect described herein or other effects that may be grasped from the present specification may be provided in addition to the above-mentioned effect or instead of the above-mentioned effect.

DESCRIPTION OF EMBODIMENTS

Figure 1:
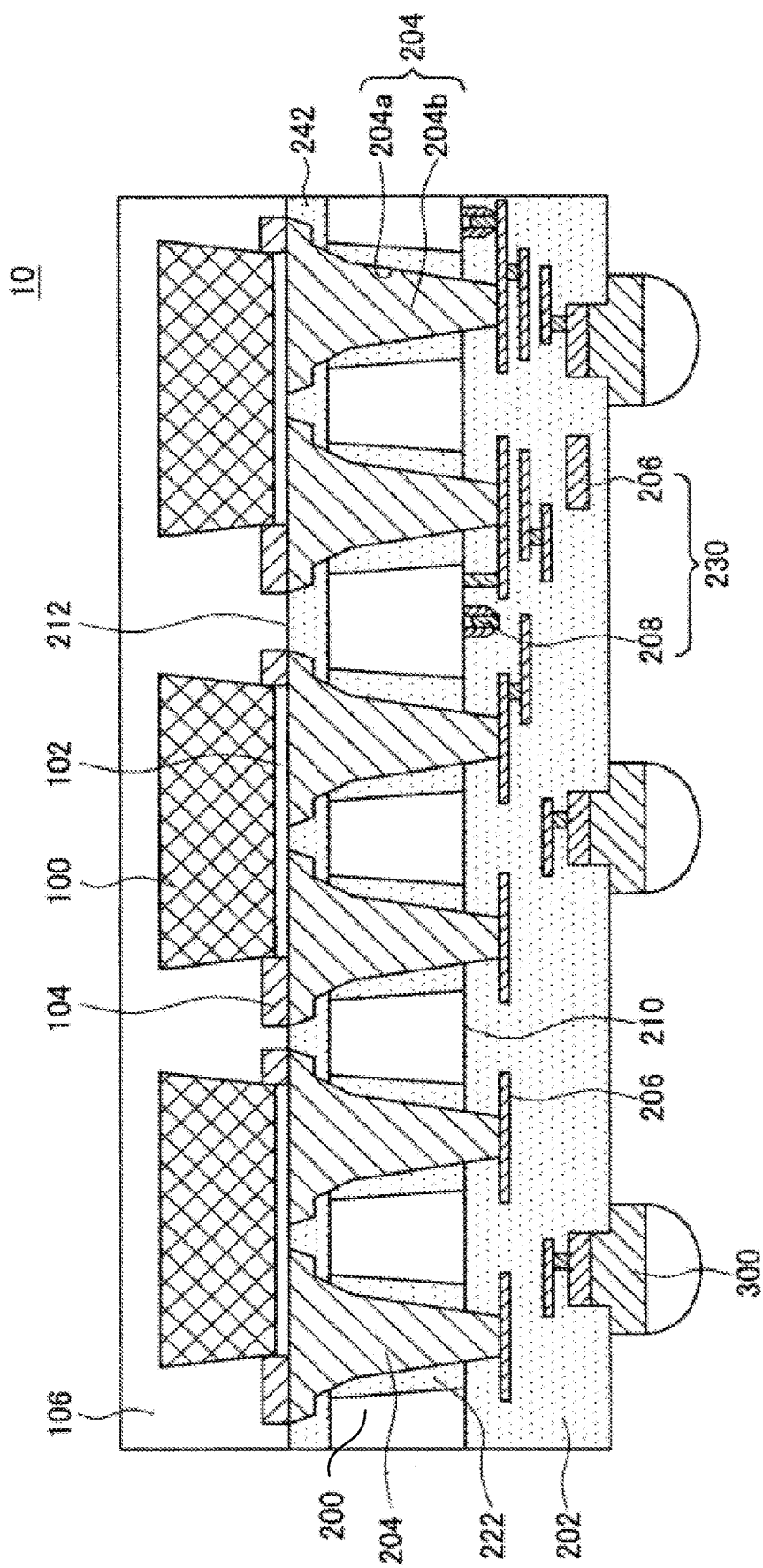
FIG. 1 is a cross-sectional view schematically illustrating a configuration example of a display device 10 according to a first embodiment of the present disclosure.
Figure 2:
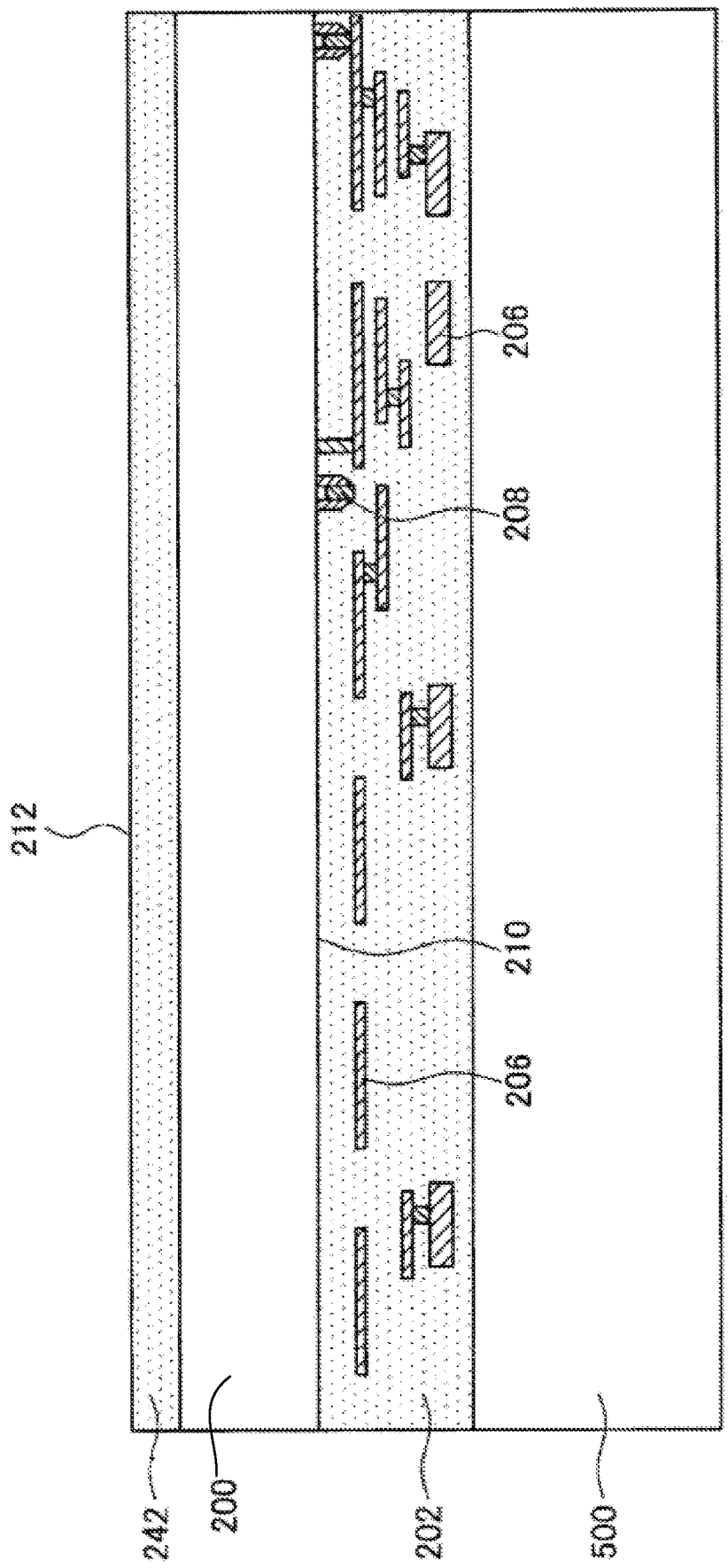
FIG. 2 is an explanatory diagram (first example) illustrating a manufacturing method of the display device 10 according to the first embodiment of the present disclosure.

Hereinafter, preferred embodiments of the present disclosure will be described in detail with reference to the attached drawings. Note that, in the present specification and the drawings, the same reference signs are provided to constituent elements with substantially the same functional configurations, and the description will not be repeated.

In addition, there are cases in which different alphabets are attached after the same reference signs to distinguish similar constituent elements in different embodiments in the present specification and the drawings. However, only the same reference signs are attached in cases where similar constituent elements do not have to be particularly distinguished.

In addition, the drawings referenced in the following description are drawings for describing the embodiments of the present disclosure and for promoting understanding of the description, and the shapes, the dimensions, the ratios, and the like illustrated in the drawings may be different from those in reality in order to facilitate the understanding of the description. Moreover, the design of a display device illustrated in the drawings, constituent elements included in the display device, and the like can be changed appropriately with reference to the following description and known techniques. Further, in the following description, an upward and downward direction of a layered structure of the display device corresponds to a relative direction in a case where the display device is arranged in such a manner that light emitted by the display device goes from down to up, unless otherwise stated.

In addition, the description regarding specific lengths (numerical value) and shapes in the following description denotes not only the same values as the mathematically defined numerical values or the geometrically defined shapes, but also includes cases in which there are differences and the like accepted in the manufacturing process and the use of the display device and the electronic equipment and includes shapes similar to the shapes. For example, in the following description, in a case in which a shape is represented as a "circular shape," it is not limited to a true circle and includes a shape similar to a true circle such as an elliptical shape.

Further, in the description regarding the following circuit (electrical connection), unless otherwise stated, "electrical connection" means connecting a plurality of elements so as to achieve electrical conduction in which electricity (signal) passes through the plurality of elements. Additionally, "electrical connection" in the following description includes not only a case where the plurality of elements is connected directly and electrically but also a case where the plurality of elements is connected indirectly and electrically through the other elements.

Note that the embodiments will be described in the following order.
1. Background That Has Led Present Inventors to Create Embodiments of Present Disclosure
2. First Embodiment
   2.1 Structure
   2.2 Manufacturing Method
3. Second Embodiment
4. Third Embodiment
5. Fourth Embodiment
6. Conclusion
7. Application Examples
8. Supplement 1. BACKGROUND THAT HAS LED PRESENT INVENTORS TO CREATE EMBODIMENTS OF PRESENT DISCLOSURE First, before describing the details of the embodiments of the present disclosure, the background that has led the present inventor to create the embodiments of the present disclosure will be described.

As has been described above, in an LED display device (semiconductor device), a plurality of light emitting elements (for example, LED elements each emitting red light, blue light, or green light) is arrayed in a matrix on a substrate, so that a video display surface for display a video or the like is constituted. In the LED display device described above, for example, there is a method by which, in order to perform active driving of the light emitting elements for each pixel, one of or a plurality of the light emitting elements included in one pixel unit is controlled. According to the method, it becomes possible to drive the light emitting elements in each pixel with higher accuracy.

However, in order to perform active driving, the light emitting elements and a drive circuit that drives the emitting elements are required to be mounted on one substrate, thereby making it difficult to avoid increase in mounting area. For example, for one pixel, there is needed a mounting area for mounting an LED chip (for example, 100 μm square) corresponding to one pixel in which three light emitting elements each emitting light of a different color are mounted (for example, a size of each element is 20 μm square), and an IC (Integrated Circuit) chip (for example, 200 μm square) in which a drive circuit that drives the light emitting elements mounted in the LED chip is mounted.

In addition, as a pixel count included in the LED display device increases more, the number of wires that electrically connect between the light emitting elements and the drive circuit increases more, resulting that leading of the wires becomes more complicated according to the increased number of wires. Thus, it is obvious that avoiding increase in mounting area becomes more difficult.

In view of this, in order to prevent increase in mounting area, it is considered that an interposer substrate is used. More specifically, the LED chip is first connected on one surface of the interposer substrate by use of solder plating, and the IC chip is connected to the other surface of the interposer substrate. However, in a case in which such a method is used, although increase in mounting area can be prevented, it is difficult to prevent a manufacturing process of the display device from being more complicated. Moreover, in a case of using such a method, since connection is made by using solder plating, miniaturization of the display device also has a limit, and further, since the interposer substrate is used, it becomes difficult to prevent increase in manufacturing costs for the display device.

To address this problem, in view of such circumstances, the present inventor has led to create the display device (semiconductor device) according to the embodiments of the present disclosure capable of preventing increase in mounting area. More specifically, the present inventor has conceived of such an idea that a drive circuit provided on one surface of a semiconductor substrate and light emitting elements provided on the other surface of the semiconductor substrate are electrically connected with each other through a through electrode that penetrates the semiconductor substrate. In this manner, it is possible to prevent increase in mounting area and prevent the manufacturing process of the display device from being more complicated. Moreover, by adopting this idea, it becomes possible to achieve miniaturization of the display device, thereby preventing increase in manufacturing costs of the display device. The embodiments of the present disclosure will sequentially be described in detail below.

2. FIRST EMBODIMENT

<2.1 Structure>

First, with reference to FIG. 1, a configuration of a display device 10 according to the first embodiment of the present disclosure will be described. FIG. 1 is a cross-sectional view schematically illustrating the configuration of the display device 10 according to the first embodiment of the present disclosure. Note that, in the following description, a layered structure of the display device 10 will be described in an order from a semiconductor substrate 200 that is positioned on a lower side in FIG. 1 to a light emitting element 100 that is positioned above the semiconductor substrate 200.

More specifically, as illustrated in FIG. 1, the display device (semiconductor device) 10 includes the semiconductor substrate 200 including silicon or the like, for example. A plurality of transistors 208 constituting a drive circuit 230 is provided on a front surface (one surface) 210 (a surface that is positioned on the lower side in FIG. 1) of the semiconductor substrate 200. Moreover, an insulating layer (insulating film) 202 is provided so as to cover the transistors 208, and a plurality of wires 206 constituting the drive circuit 230 is provided in the insulating layer 202. The wire 206 is electrically connected with the transistor 208 described above and a through electrode 204 described later. In other words, in the present embodiment, the drive circuit 230 that drives the light emitting element 100 described later includes the transistor 208 and the wire 206 and is provided on the front surface 210 of the semiconductor substrate 200.

Further, an insulating layer 242 is provided on a back surface (the other surface) 212 (a surface that is positioned on an upper side in FIG. 1) of the semiconductor substrate 200. Note that the insulating layers 202 and 242 can be formed to include an insulating film such as $SiO_x$ (silicon oxide), $SiN_x$ (silicon nitride), or $SiO_xN_y$ (silicon oxynitride). In addition, the wire 206 can be formed to include a metal material or a metal compound material containing a metal such as Au (gold), Ag (silver), Cu (copper), Pt (platinum), Al (aluminum), W (tungsten), Zn (zinc), or Sn (tin).

Further, in the present embodiment, a bump 300 that electrically connects the wire 206 to electrically connect another substrate (not illustrated) may be provided on the insulating layer 202. For example, the bump 300 can be formed to include a metal material such as Au, Al, Cu, or Ag.

Then, in the present embodiment, there is provided the through electrode 204 penetrating from the front surface 210 side of the semiconductor substrate 200 to the back surface (the other surface) 212 (the surface that is positioned on the upper side in FIG. 1). The through electrode 204 electrically connects the drive circuit 230 provided on the front surface 210 of the semiconductor substrate 200 with the light emitting element 100 (to be described in detail later) provided on the back surface 212 of the semiconductor substrate 200. The through electrode 204 includes a through hole 204a that penetrates the semiconductor substrate 200 and a metal film 204b containing Cu, W, Al, or Ta (tantalum) that is buried in the through hole 204a.

Moreover, the through electrode 204 is a circular column illustrated as a tapered shape whose width is narrower toward the front surface 210 from the back surface 212 in the cross-section of FIG. 1. The present embodiment is not limited to such a shape. In the present embodiment, it is sufficient if the through electrode 204 has such a shape that the drive circuit 230 and the light emitting element 100 can be electrically connected with each other, and, for example, the through electrode 204 may not have a tapered shape and may have a rectangular column. Note that, in the example of FIG. 1, a diameter of the through electrode 204 on the back surface 212 is approximately 3 μm.

Further, the through electrode 204 has an insulating film 222 including $SiO_x$ or the like provided thereon so as to cover an outer periphery of the through electrode 204 in order to prevent short-circuiting with the semiconductor substrate 200. Furthermore, in the present embodiment, a barrier metal film (not illustrated) may be provided between the metal film 204b of the through electrode 204 and the insulating film 222 that surrounds the outer periphery of the through electrode 204. The barrier metal film can be formed to include a material such as TiN (titanium nitride), for example.

In addition, in the present embodiment, each of the light emitting elements 100 is provided on the back surface 212 of the semiconductor substrate 200 so as to straddle two of the through electrodes 204. The light emitting element 100 is a light emitting element emitting red light, blue light, or green light, for example, and a light emitting diode (LED) including a material of a group III-V compound semiconductor or an AlGaInP-based compound semiconductor (red light emitting element), for example. Further, in the present embodiment, the light emitting element 100 is not limited to such a light emitting diode, but may be formed to include a semiconductor laser element or the like. More specifically, the light emitting element 100 has a layered structure in which compound semiconductor layers (not illustrated) having conductivities different from each other, and a light emitting layer (not illustrated) sandwiched by the compound semiconductor layers are layered. Further, the light emitting element 100 has one electrode that is electrically connected with one of the compound semiconductor layers and the other electrode that is electrically connected with the other one of the compound semiconductor layers. To be more specific, in the present embodiment, as illustrated in FIG. 1, a lower electrode (first electrode) 102 provided below the light emitting element 100 is electrically connected with the through electrode 204 through a contact 104 (for example, a solder plate). Note that, in the present embodiment, a mode of the light emitting element 100 is not limited to one described above.

Note that, for example, a material of the group III-V compound semiconductor can include, GaN-based compound semiconductor (including AlGaN mixed crystal, AlGaInN mixed crystal, or GaInN mixed crystal), GaInNAs-based compound semiconductor (including GaInAs mixed crystal or GaNAs mixed crystal), AlGaInP-based compound semiconductor, AlAs-based compound semiconductor, AlGaInAs-based compound semiconductor, AlGaAs-based compound semiconductor, GaInAs-based compound semiconductor, GaInAsP-based compound semiconductor, GaInP-based compound semiconductor, GaP-based compound semiconductor, InP-based compound semiconductor, InN-based compound semiconductor, AlN-based compound semiconductor, and the like.

Also, as a manufacturing method of such light emitting element 100 described above, it is possible to use a metalorganic chemical vapor deposition method (MOCVD method, MOVPE method), a metalorganic molecular beam epitaxy method (MOMBE method), a plasma-assisted physical chemical vapor deposition method (PPD method), an atomic layer deposition method (ALD method), and the like.

Moreover, in the present embodiment, the light emitting element 100 is covered with a transparent resin layer (transparent resin) 106. The transparent resin layer 106 can be formed to include a transparent resin material such as silicone resin, acrylic resin, polyimide resin, or epoxy resin.

<2.2 Manufacturing Method>

Next, a manufacturing method of the display device 10 according to the present embodiment will be described with reference to FIGS. 2 to 14. FIGS. 2 to 14 are explanatory diagrams illustrating the manufacturing method of the display device 10 according to the first embodiment of the present disclosure, and specifically, illustrate a cross-section of the display device 10 corresponding to the cross-section of FIG. 1 depicting the display device 10 in each stage of the manufacturing method. Note that an upward and downward direction of the display device 10 is reversed between FIGS. 2 to 10 and FIGS. 11 to 14.

First, the transistor 208, the wire 206, and the insulating layer 202 which constitute the drive circuit 230 are formed on the front surface 210 of the semiconductor substrate 200. Further, for example, a support substrate 500 configured from a silicon substrate, a quartz substrate, or the like is bonded onto the insulating layer 202 by use of plasma bonding, adhesive, or the like. Then, after the support substrate 500 is bonded to the insulating layer 202, a back surface 212 side of the semiconductor substrate 200 is ground to thin the semiconductor substrate 200, and an insulating layer 242 is layered over the back surface 212 side thus ground by use of a chemical vapor deposition method (CVD method). Thus, a mode illustrated in FIG. 2 can be obtained.

Figure 3:
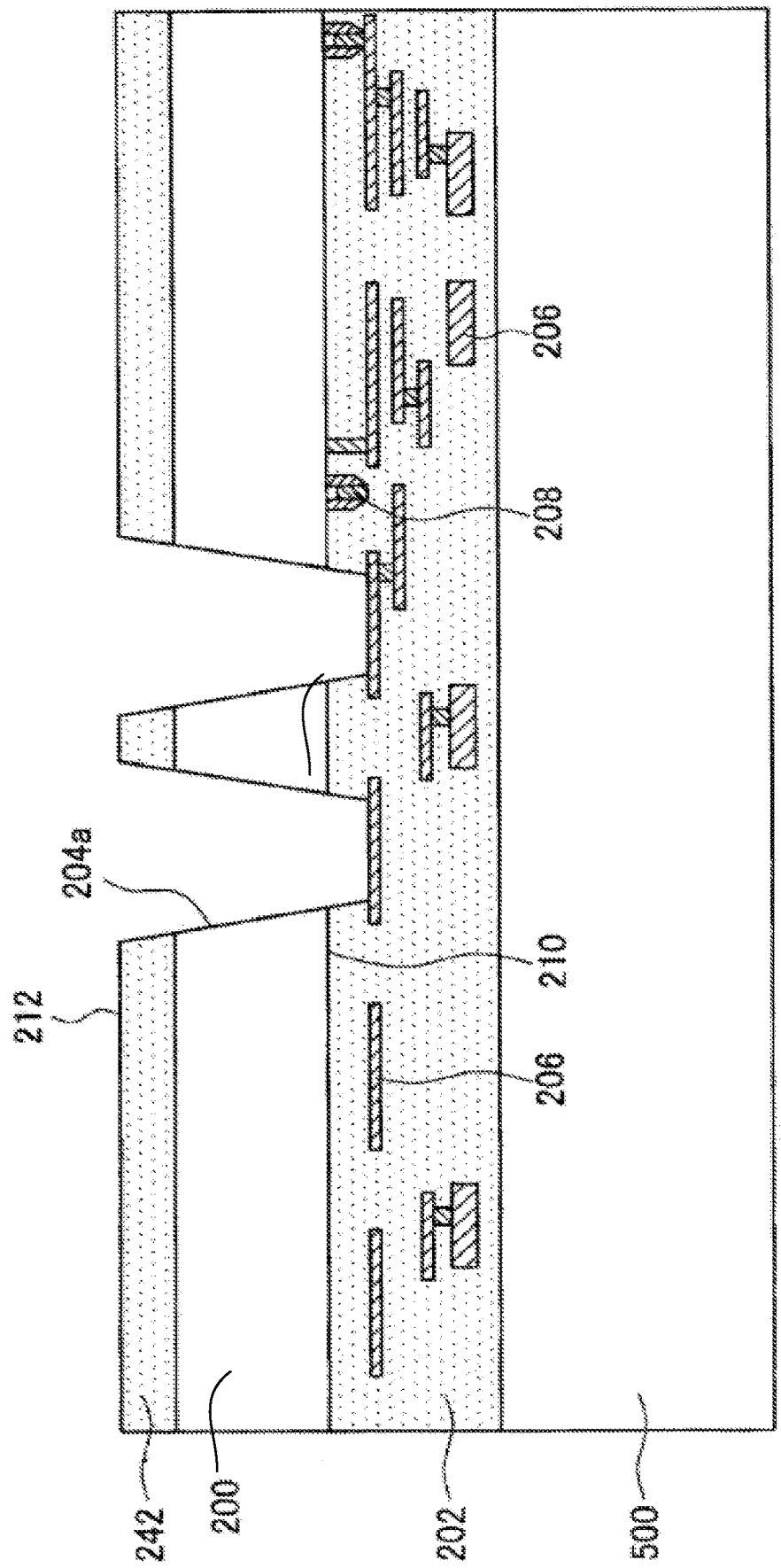
FIG. 3 is an explanatory diagram (second example) illustrating the manufacturing method of the display device 10 according to the first embodiment of the present disclosure.

Next, a photoresist (not illustrated) is formed over the back surface 212, and the formed photoresist is patterned and selectively etched according to the pattern, to thereby form the through hole 204a illustrated in FIG. 3.

Figure 4:
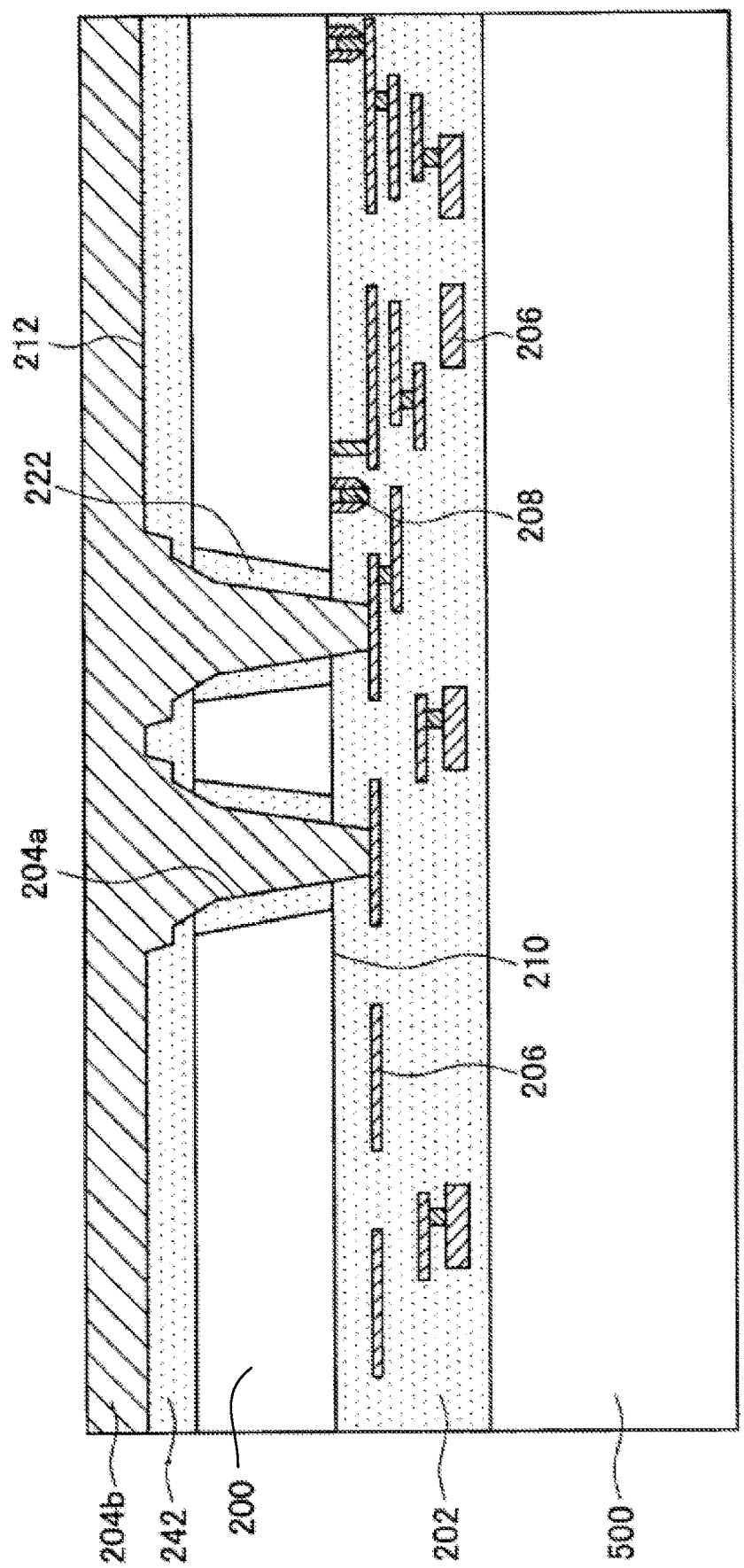
FIG. 4 is an explanatory diagram (third example) illustrating the manufacturing method of the display device 10 according to the first embodiment of the present disclosure.

Then, by use of the CVD method (chemical vapor deposition method) or the like, the insulating film 222 is formed so as to cover an inner wall of the through hole 204a, and thereafter, a seed metal such as Ta or Cu is formed over the insulating fil 222 by use of sputtering or the like. Moreover, as illustrated in FIG. 4, the metal film 204b such as Cu is formed by plating, so that the metal film 204b having a portion that is buried in the through hole 204a can be formed.

Figure 5:
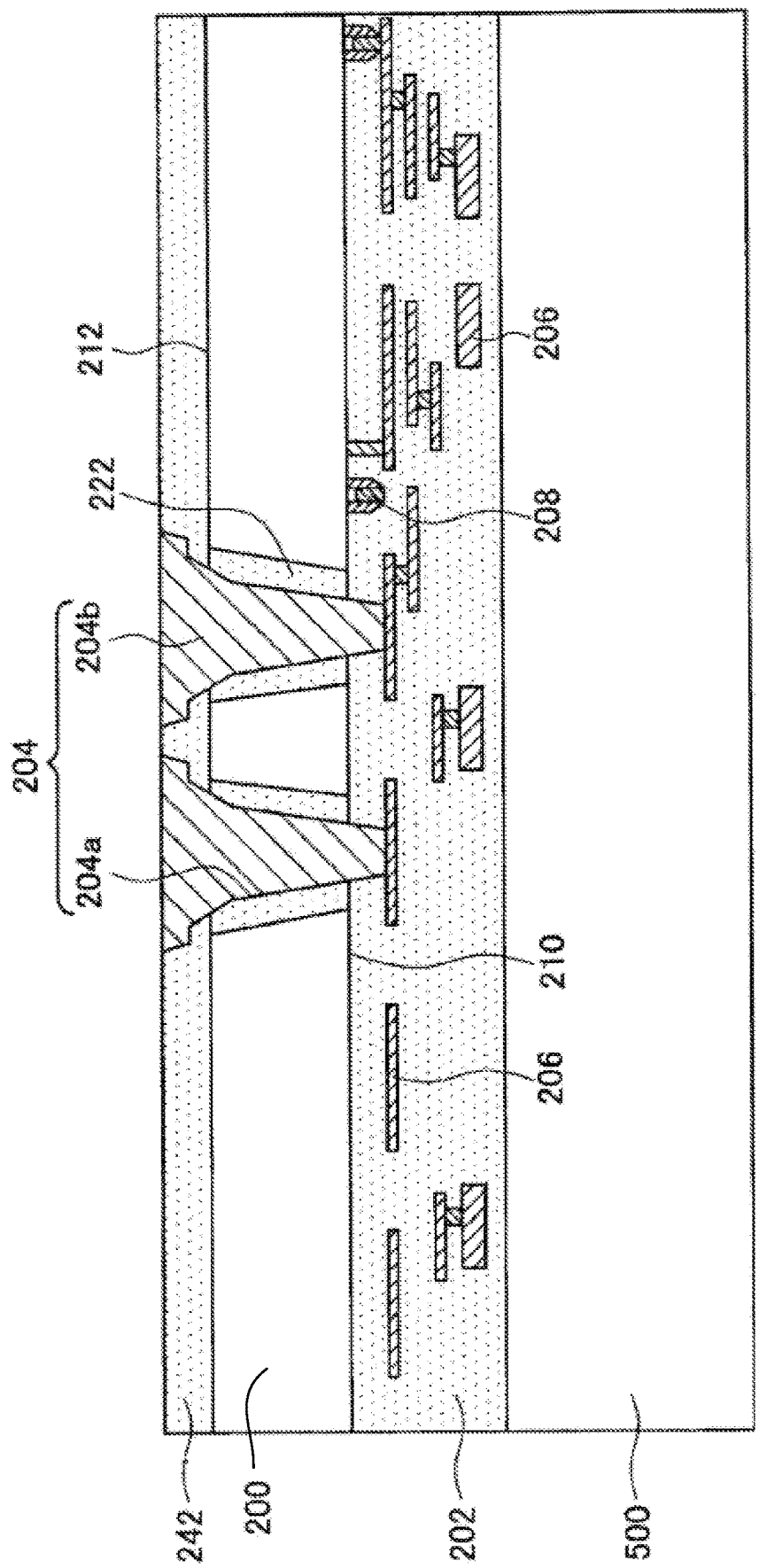
FIG. 5 is an explanatory diagram (fourth example) illustrating the manufacturing method of the display device 10 according to the first embodiment of the present disclosure.

Next, planarization is carried out on the metal film 204b on the back surface 212 by use of a CMP (Chemical Mechanical Polish) method, so that the through electrode 204 illustrated in FIG. 5 can be obtained.

Figure 6:
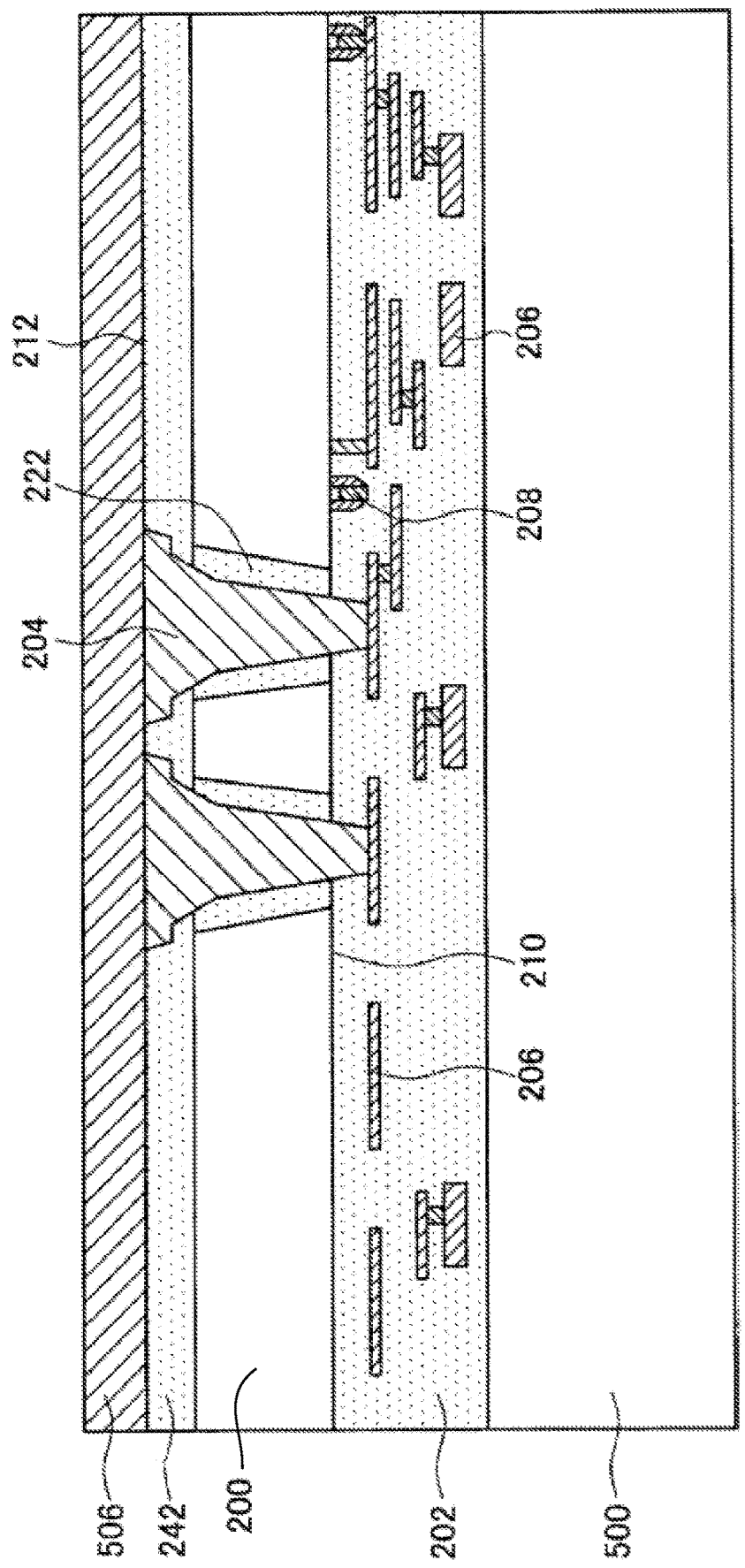
FIG. 6 is an explanatory diagram (fifth example) illustrating the manufacturing method of the display device 10 according to the first embodiment of the present disclosure.

Further, as illustrated in FIG. 6, a resin layer 506 is formed over the back surface 212.

Figure 7:
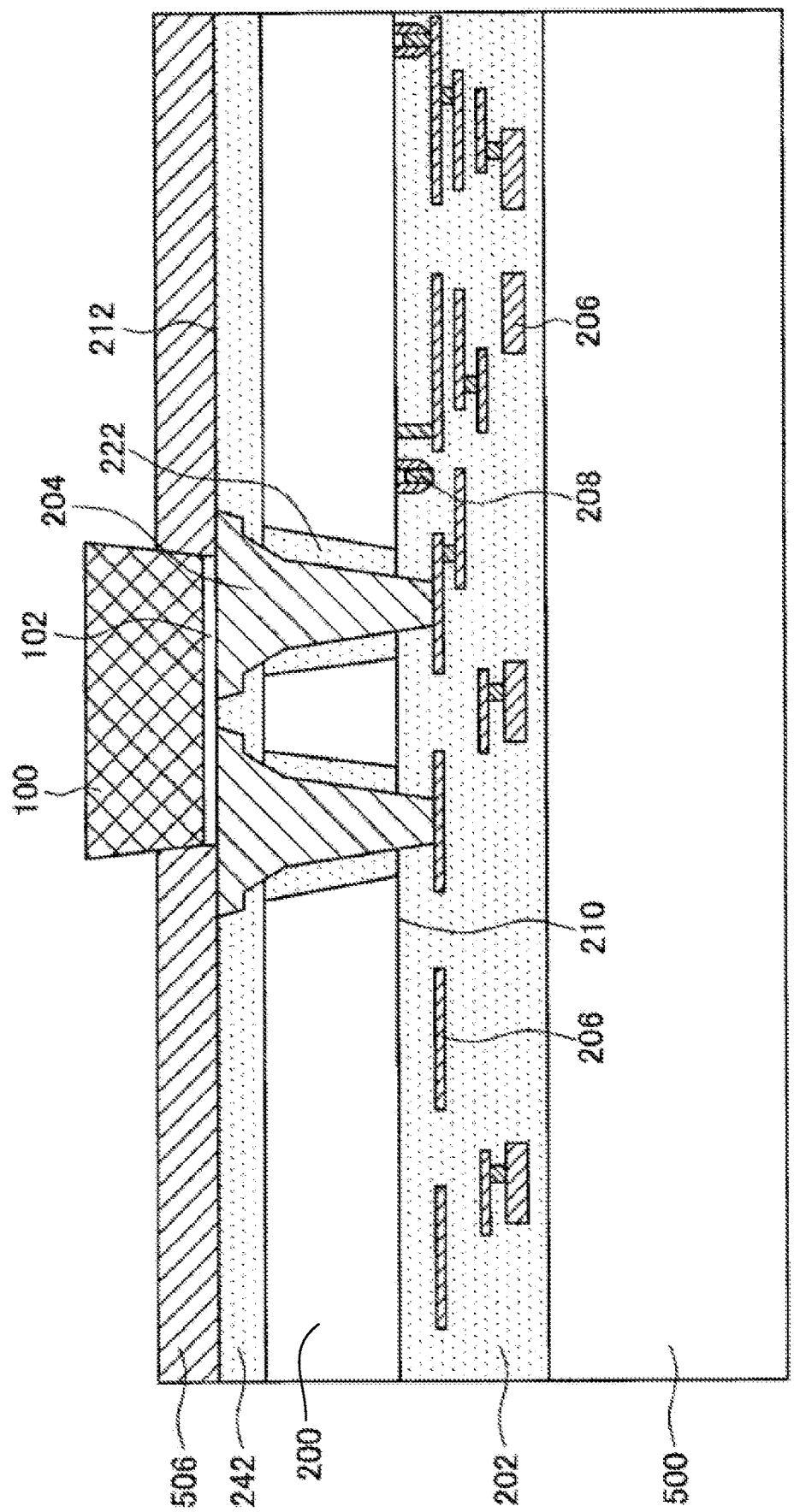
FIG. 7 is an explanatory diagram (sixth example) illustrating the manufacturing method of the display device 10 according to the first embodiment of the present disclosure.

After that, the resin layer 506 is subjected to patterning. At this time, it is configured that the through electrode 204 is positioned below a portion that serves as a trench in the pattern of the resin layer 506 in FIG. 7. Then, the light emitting element 100 is buried in the portion corresponding to the trench, thereby achieving such a mode as depicted in FIG. 7.

Figure 8:
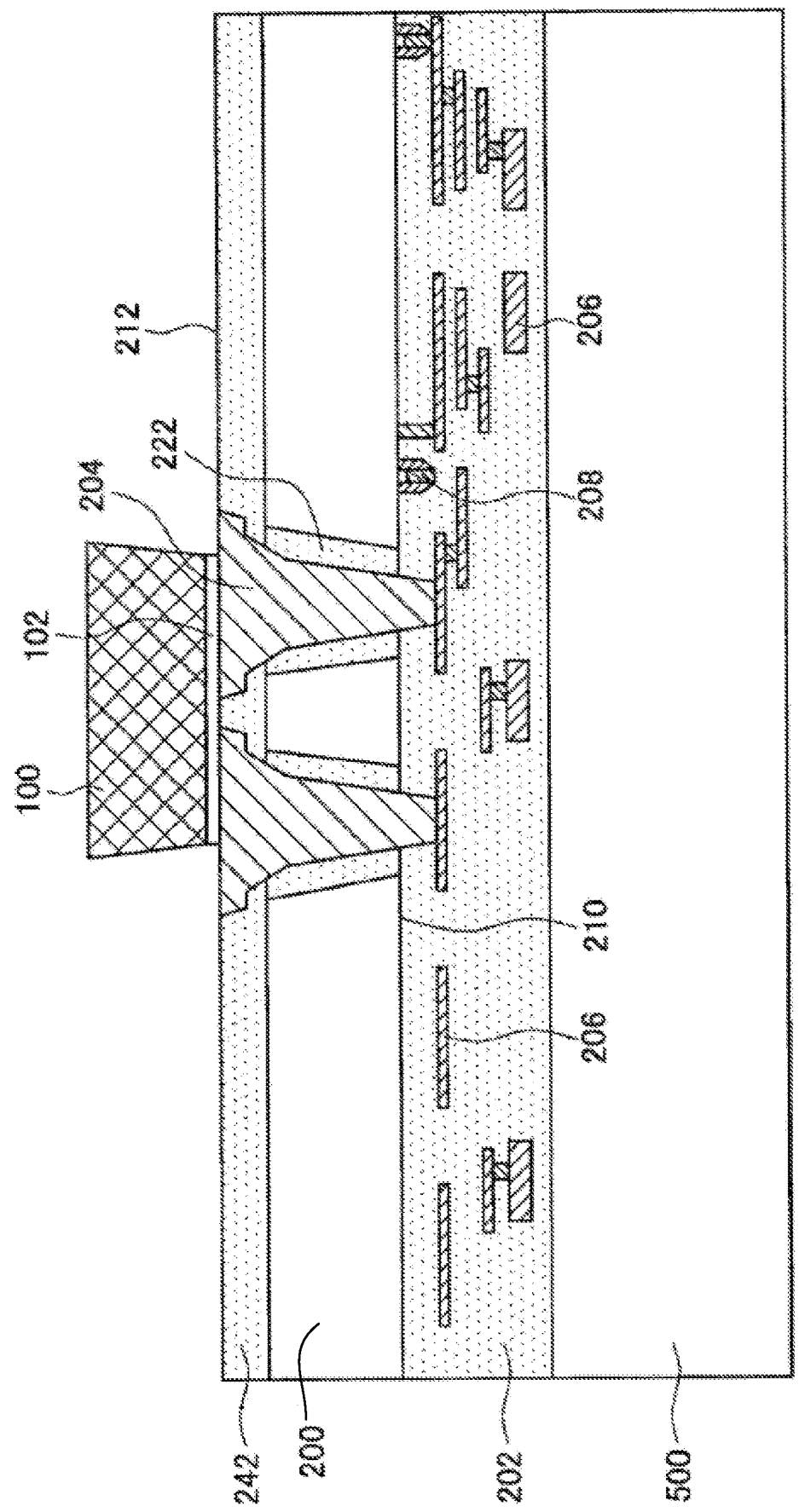
FIG. 8 is an explanatory diagram (seventh example) illustrating the manufacturing method of the display device 10 according to the first embodiment of the present disclosure.

Moreover, as illustrated in FIG. 8, the resin layer 506 is removed. At this time, all or part of the resin layer 506 may be removed.

Figure 9:
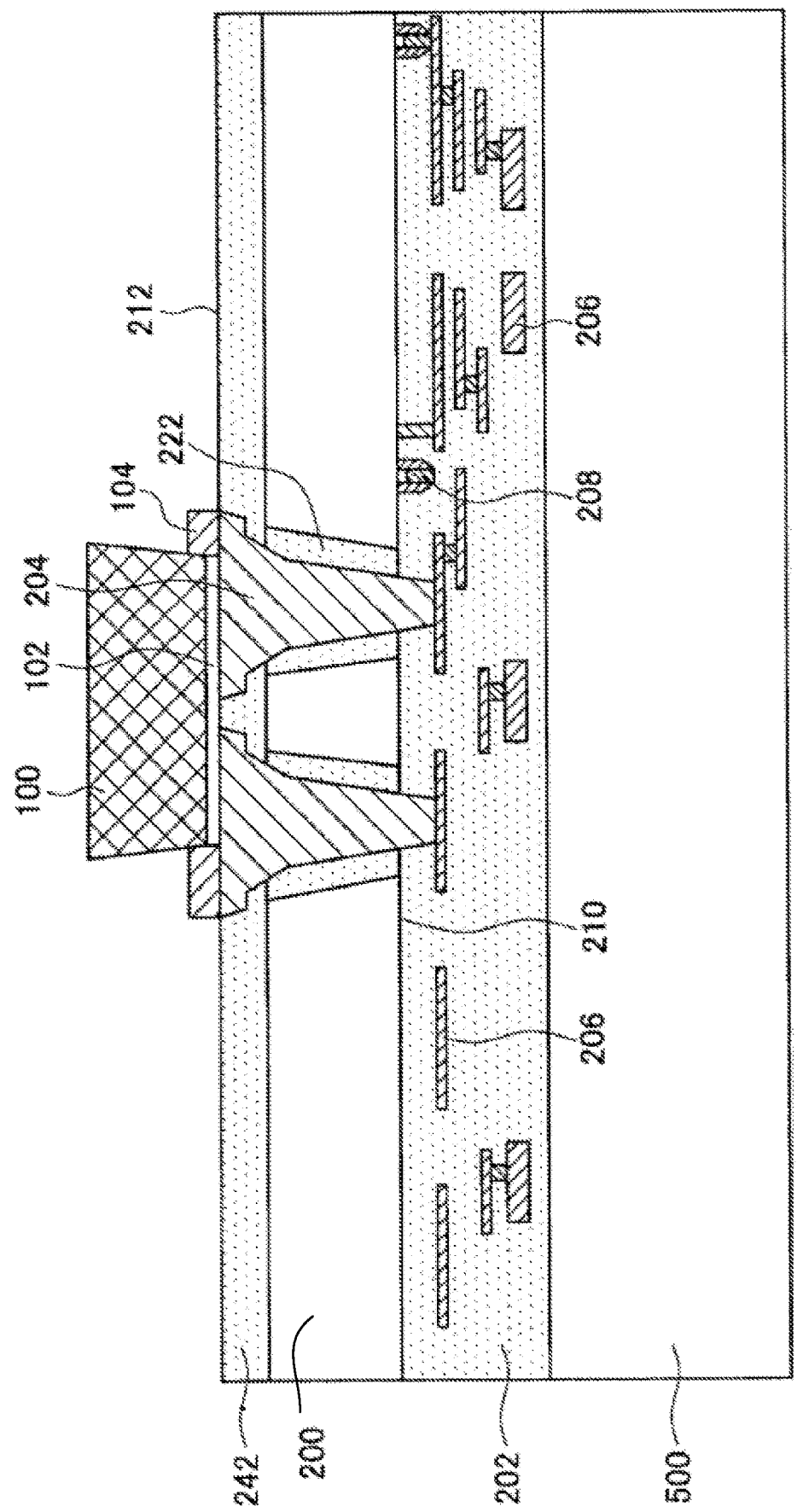
FIG. 9 is an explanatory diagram (eighth example) illustrating the manufacturing method of the display device 10 according to the first embodiment of the present disclosure.

Next, the lower electrode 102 of the light emitting element 100 and the through electrode 204 are electrically connected to each other by copper plating, the resin layer 506 is removed by a wet process or the like as needed, and a heat treatment is carried out, and accordingly, such a mode as illustrated in FIG. 9 can be obtained.

Figure 10:
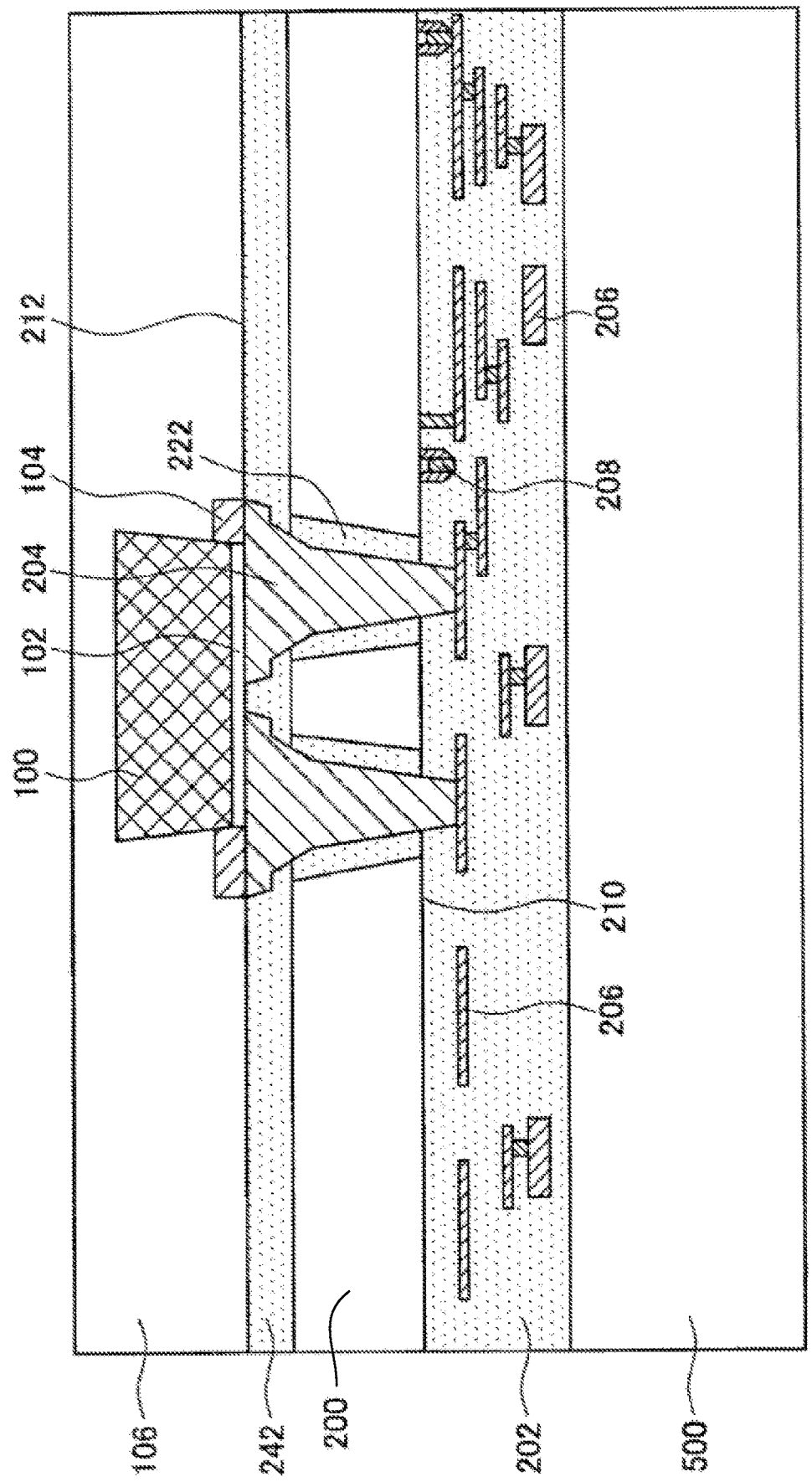
FIG. 10 is an explanatory diagram (ninth example) illustrating the manufacturing method of the display device 10 according to the first embodiment of the present disclosure.

After that, the transparent resin layer 106 is formed so as to cover the back surface 212 of the semiconductor substrate 200 and the light emitting element 100, and an upper surface of the transparent resin layer 106 (a surface that is positioned on an upper side of FIG. 10) is flattened by the CPM method. In this manner, such a mode as illustrated in FIG. 10 can be obtained.

Figure 11:
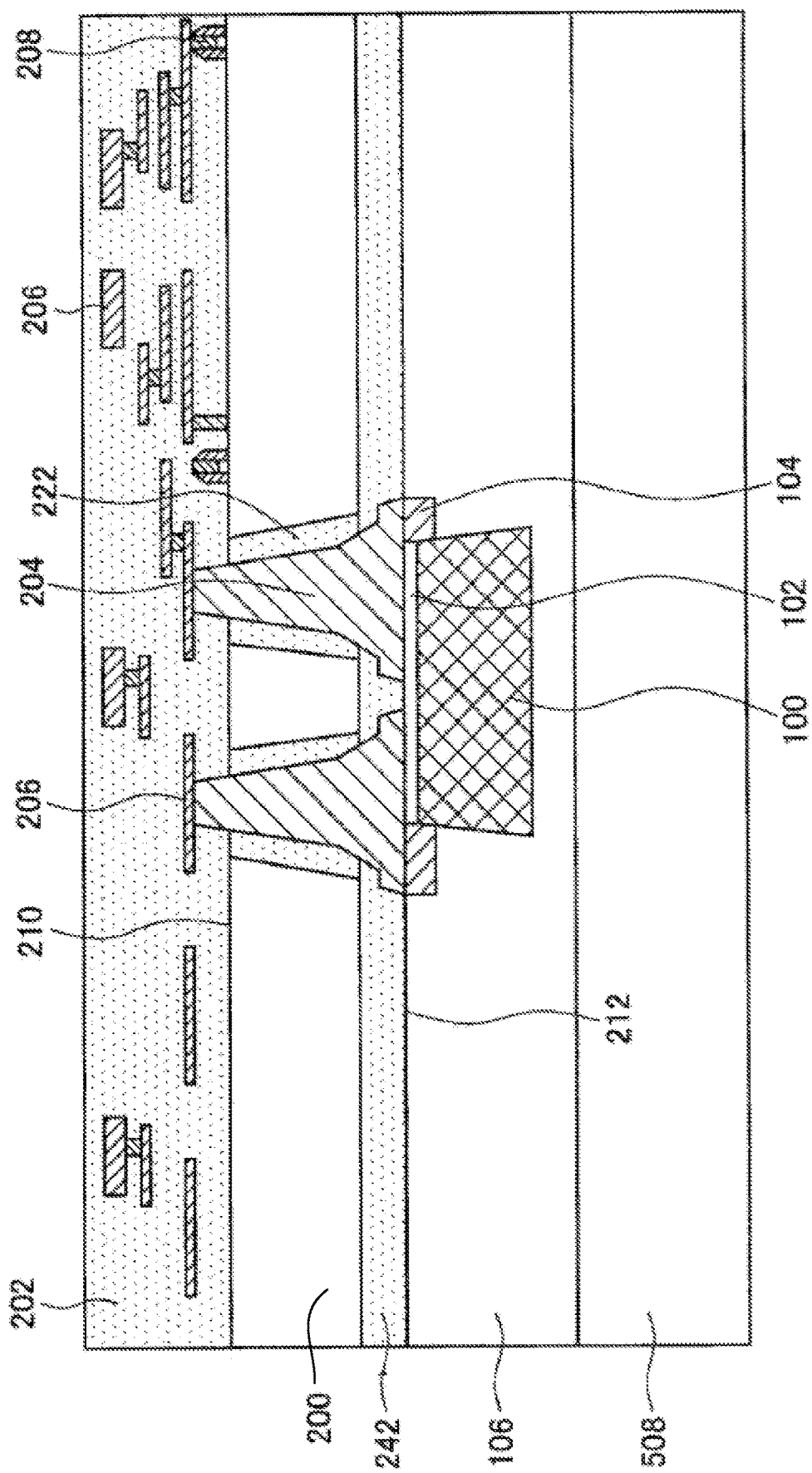
FIG. 11 is an explanatory diagram (tenth example) illustrating the manufacturing method of the display device 10 according to the first embodiment of the present disclosure.

Further, in order to change a processing surface, a support substrate 508 such as a quartz substrate is bonded onto the transparent resin layer 106, and the support substrate 500 is removed, so that such a mode as illustrated in FIG. 11 can be obtained.

Figure 12:
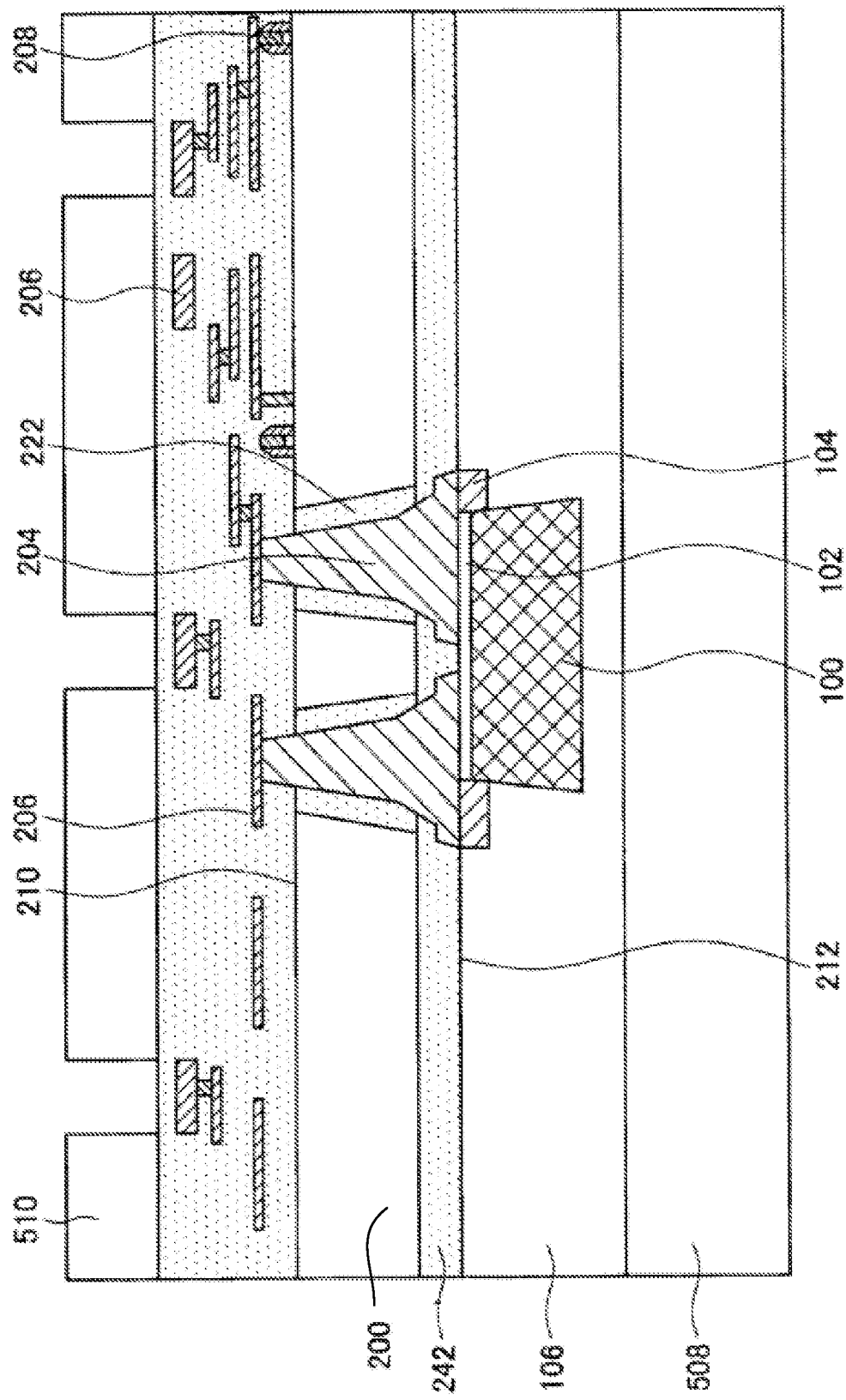
FIG. 12 is an explanatory diagram (eleventh example) illustrating the manufacturing method of the display device 10 according to the first embodiment of the present disclosure.

Then, as illustrated in FIG. 12, a photoresist 510 is formed over the insulating layer 202, and patterning is carried out on the photoresist 510.

Figure 13:
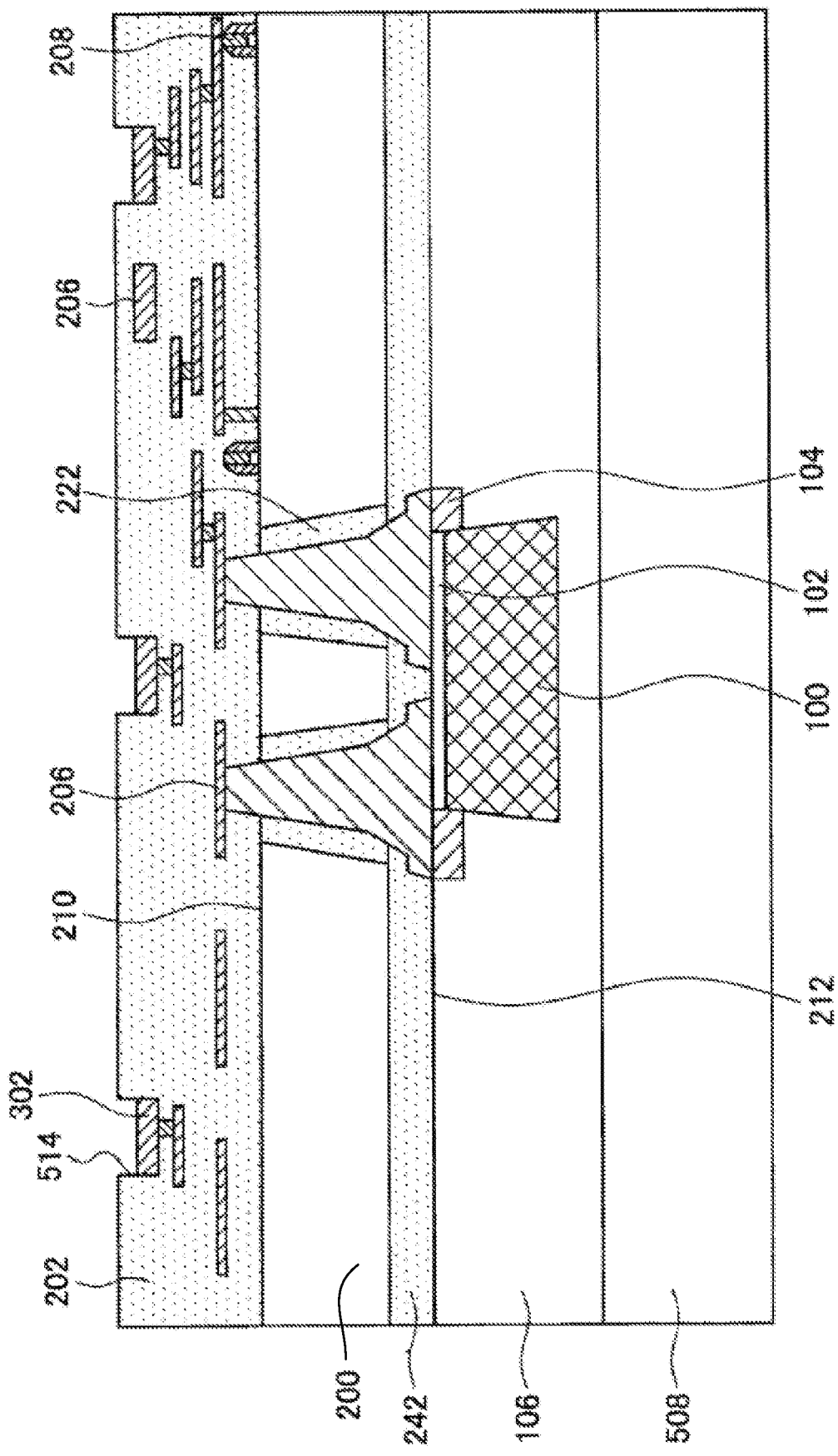
FIG. 13 is an explanatory diagram (twelfth example) illustrating the manufacturing method of the display device 10 according to the first embodiment of the present disclosure.

Next, according to the pattern of the photoresist 510, the insulating layer 202 is selectively etched, and an electrode 302 including a metal film is formed in a portion corresponding to a trench 514 formed by etching, so that such a mode as illustrated in FIG. 13 can be obtained.

Figure 14:
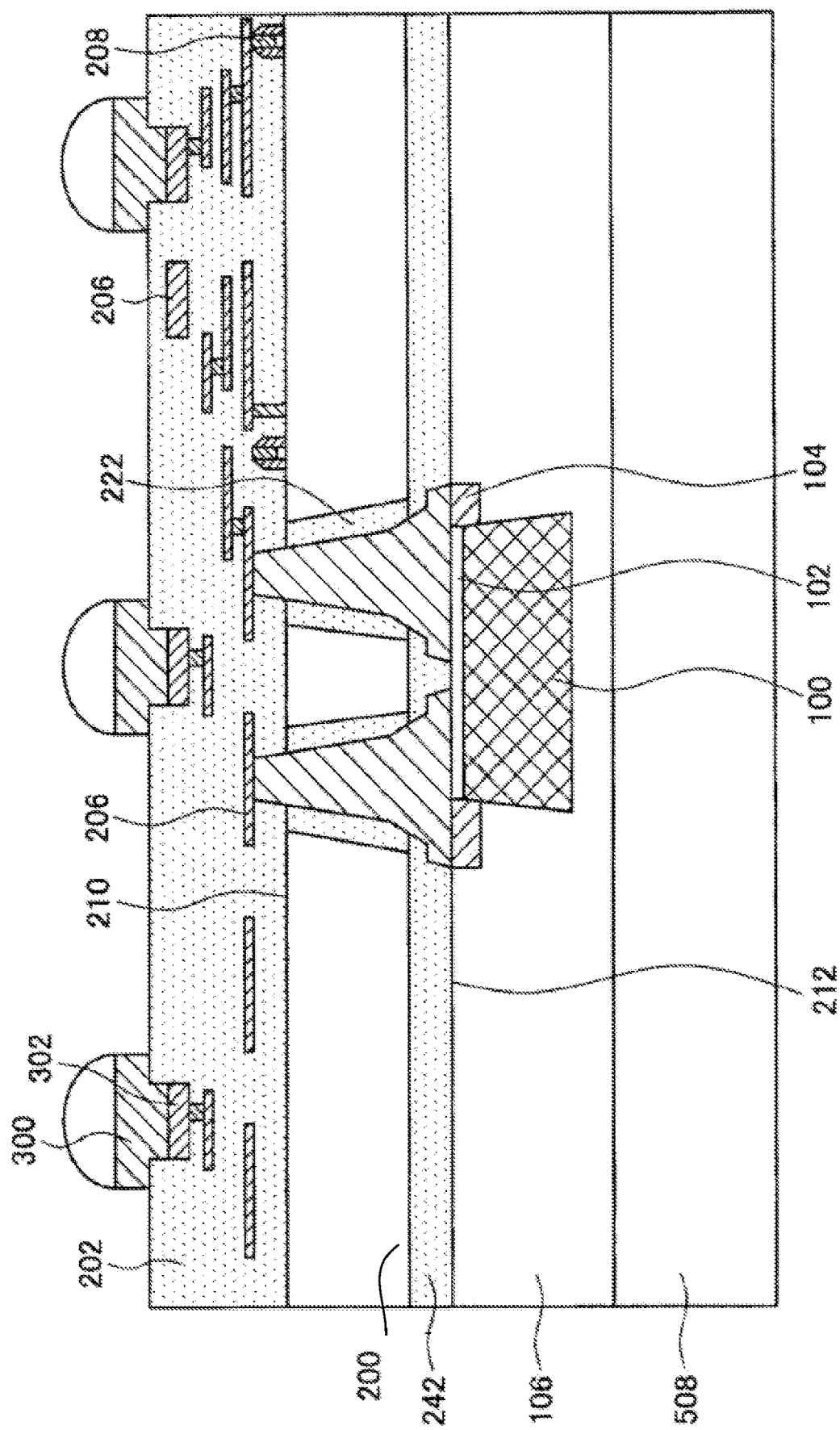
FIG. 14 is an explanatory diagram (thirteenth example) illustrating the manufacturing method of the display device 10 according to the first embodiment of the present disclosure.

Then, as illustrated in FIG. 14, a bump 300 is formed on the electrode 302. Moreover, the support substrate 508 is removed, and accordingly, the display device 10 according to the present embodiment can be obtained (see FIG. 1).

Note that, in the present embodiment, a method of forming the layers and the films described above includes, for example, physical vapor deposition method (PVD method), the CVD method, and the like. Examples of the PVD method include a vacuum vapor deposition using resistance heating or high-frequency heating, an EB (electron beam) deposition method, various types of sputtering methods (a magnetron sputtering method, an RF-DC coupled magnetron sputtering method, an ECR (Electron Cyclotron Resonance) sputtering method, a facing target sputtering method, a radio frequency sputtering method, or the like), an ion plating method, a laser ablation method, a molecular beam epitaxy (MBE) method, a laser transfer method, and the like. In addition, examples of the CVD method include a plasma CVD method, thermal CVD method, an MOCVD method, a photo-CVD method, and the like. Moreover, as other methods for forming the layers and the films described above, there are various types of printing methods such as an electrolytic plating method and an electroless plating method, a spin coating method, a dipping method, a casting method, a micro contact printing method, a drop casting method, a screen printing method, an ink-jet printing method, an offset printing method, a gravure printing method, and a flexographic printing method. There are various types of coating methods such as a stamp method, a spray method, an air doctor coating method, a blade coating method, a rod coating method, a knife coating method, a squeeze coating method, a reverse roll coating method, a transfer roll coating method, a gravure coating method, a kiss coating method, a cast coating method, a spray coating method, a slit orifice coating method, and a calendar coating method. Also, examples of patterning methods for each layer include chemical etching such as a shadow mask, a laser transfer, and a photolithography, and a physical etching such as an ultraviolet ray and a laser beam. In addition, examples of the planarization technique include a CMP method, a laser planarizing method, a reflow method, and the like. In other words, the display device 10 according to the present embodiment can be manufactured easily and at a low cost, by using the existing manufacturing process for a semiconductor device.

As described above, in the present embodiment, the through electrode 204 that penetrates the semiconductor substrate 200 is provided, the through electrode 204 electrically connecting the drive circuit 230 provided on the front surface 210 of the semiconductor substrate 200 with the light emitting element 100 provided on the back surface 212 of the semiconductor substrate 200. According to the present embodiment, use of such a through electrode 204 can reduce a need for leading, in a complicated manner, the wires that electrically connect the drive circuit 230 and the light emitting element 100. As a result, according to the present embodiment, it is possible to prevent increase in mounting area on which the drive circuit 230 and the light emitting element 100 are mounted and prevent the manufacturing process of the display device 10 from being more complicated. Further, since it is possible to form the fine through electrode 204 in the present embodiment, miniaturization of the display device 10 can be implemented. In addition, in the present embodiment, there is no need for an interposer substrate, and accordingly, increase in manufacturing costs of the display device 10 can be prevented.

3. SECOND EMBODIMENT

Figure 15:
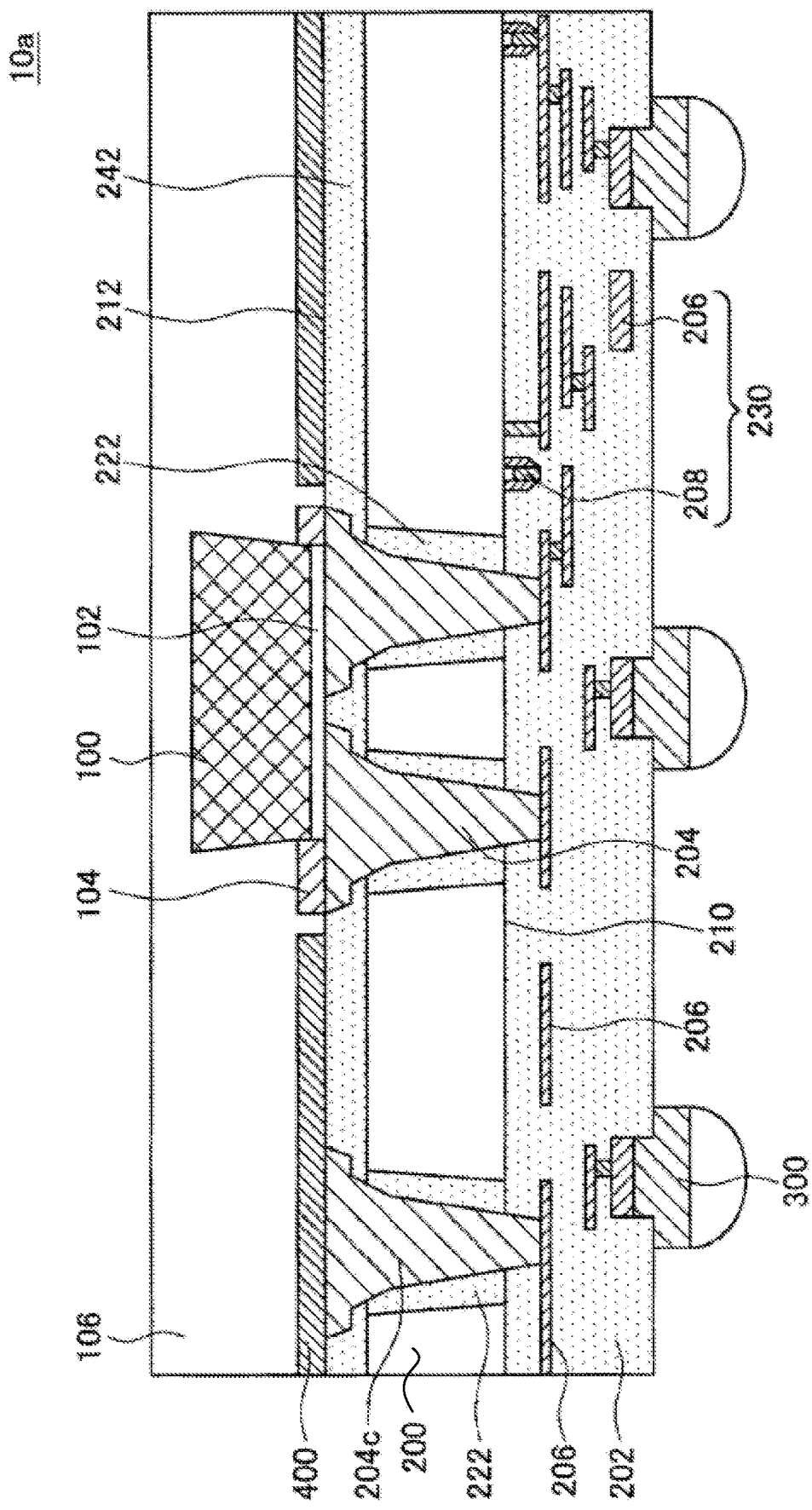
FIG. 15 is a cross-sectional view schematically illustrating a configuration example of a display device 10a according to a second embodiment of the present disclosure.

Meanwhile, the light emitting element 100 generates heat at a time of light emission. Accordingly, in order to prevent the light emitting element 100 or the like from being degraded due to the generated heat, it is preferable to provide a mechanism for heat dissipation in the display device 10. As a second embodiment of the present disclosure, a display device 10a provided with a heat dissipation mechanism will be described below with reference to FIG. 15. FIG. 15 is a cross-sectional view schematically illustrating a configuration of the display device 10a according to the second embodiment of the present disclosure.

As illustrated in FIG. 15, as with the first embodiment described above, in the display device (semiconductor device) 10a according to the present embodiment, the drive circuit 230 is provided on the front surface 210 (the surface that is positioned on the lower side in FIG. 15) of the semiconductor substrate 200. Also, in the present embodiment, as with the first embodiment, the bump 300 may be provided for electrically connecting the wire 206 to thereby electrically connect with another substrate (not illustrated) therethrough.

Moreover, also in the present embodiment, as with the first embodiment, the insulating layer 242 and the light emitting element 100 are provided on the back surface 212 (the surface that is positioned on the upper side in FIG. 15) of the semiconductor substrate 200.

Then, also in the present embodiment, as with the first embodiment, there is provided the through electrode 204 that penetrates the semiconductor substrate 200 from the front surface 210 side to the back surface 212. The through electrode 204 electrically connects the drive circuit 230 and the light emitting element 100, as has been described above.

Moreover, in the present embodiment, a heat dissipation film 400 is provided on the insulating layer 242 that is positioned on the periphery of the light emitting element 100. The heat dissipation film 400 is a film including a material having a higher heat conductivity, and can be formed by including a metal material such as Al, Cu, Ag, or Au, a carbon material such as C (carbon), or the like, for example.

Further, as illustrated in FIG. 15, the heat dissipation film 400 may be connected to a through electrode (another through electrode) 204c that penetrates the semiconductor substrate 200. The through electrode 204c enables the heat dissipation film 400 to be connected to the heat dissipation mechanism (not illustrated) provided on the front surface 210 side of the semiconductor substrate 200, so that a heat generated from the light emitting element 100 can be escaped outside the display device 10a by the heat dissipation mechanism through the heat dissipation film 400 and the through electrode 204c. Note that, since the through electrode 204c has the similar configuration to the through electrode 204 described above, the through electrode 204c can be formed similarly to the through electrode 204.

As described above, according to the present embodiment, providing the heat dissipation film 400 allows heat generated from the light emitting element 100 to be efficiently radiated outside. As a result, according to the present embodiment, it is possible to prevent degradation of the light emitting element 100 and the like due to the generated heat.

4. THIRD EMBODIMENT

Figure 16:
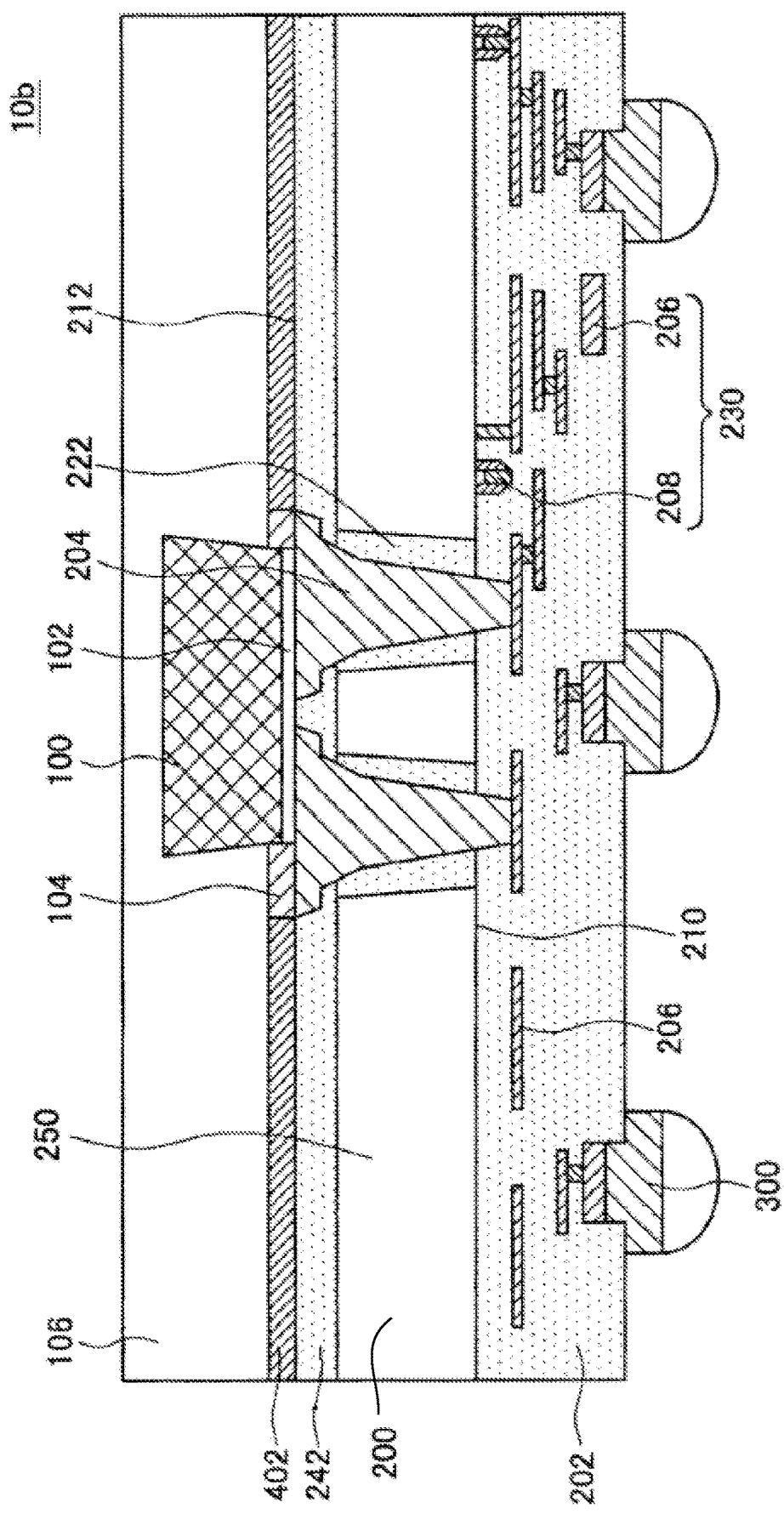
FIG. 16 is a cross-sectional view schematically illustrating a configuration example of a display device 10b according to a third embodiment of the present disclosure.

Meanwhile, a semiconductor layer 250 (see FIG. 16) of the semiconductor substrate 200 may possibly be degraded due to light from the light emitting element 100, and the degradation of the semiconductor layer 250 may cause degradation of properties of the transistor 208 of the drive circuit 230 or the like. Accordingly, in order to prevent degradation of the semiconductor layer 250 due to the light emitted from the light emitting element 100, in the display device 10, it is preferable to provide a light-shielding film. As a third embodiment of the present disclosure, a display device 10b provided with a light-shielding film 402 will be described below with reference to FIG. 16. FIG. 16 is a cross-sectional view schematically illustrating a configuration of the display device 10b according to the third embodiment of the present disclosure.

As illustrated in FIG. 16, in the display device (semiconductor device) 10b according to the present embodiment, as with the first embodiment described above, the drive circuit 230 is provided on the front surface 210 (the surface that is positioned on the lower side in FIG. 16) of the semiconductor substrate 200. Moreover, also in the present embodiment, as with the first embodiment, the insulating layer 242 and the light emitting element 100 are provided on the back surface 212 (the surface that is positioned on the upper side in FIG. 16) side of the semiconductor substrate 200. Then, also in the present embodiment, as with the first embodiment, the through electrode 204 that penetrates the semiconductor substrate 200 from the front surface 210 side to the back surface 212 is provided. The through electrode 204 electrically connects the drive circuit 230 with the light emitting element 100, as has been described above.

Further, in the present embodiment, the light-shielding film 402 is provided on the insulating layer 242 that is positioned on the periphery of the light emitting element 100. The light-shielding film 402 is a film including a material that blocks light from the light emitting element 100, and, for example, can be formed by including a metal material or a metal compound material containing a metal such as Ti (titanium), Cr (chromium), Ni (nickel), W, Ta, or Al.

As described above, according to the present embodiment, providing the light-shielding film 402 makes it possible to block light entering the semiconductor layer 250 from the light emitting element 100. As a result, according to the present embodiment, degradation of the semiconductor layer 250 due to light from the light emitting element 100 can be prevented.

5. FOURTH EMBODIMENT

In the first embodiment described above, such a description has been given that the lower electrode 102 of the light emitting element 100 is electrically connected to the through electrode 204. However, in the embodiments of the present disclosure, a mode of the light emitting element 100 is not limited to this, and, for example, the light emitting element 100 may include an upper electrode 112 that is provided above the light emitting element 100. As a fourth embodiment of the present disclosure, a display device 10c provided with the light emitting element 100 including the upper electrode 112 will be described below with reference to FIG. 17. FIG. 16 is a cross-sectional view schematically illustrating a configuration of the display device 10c according to the fourth embodiment of the present disclosure.

Figure 17:
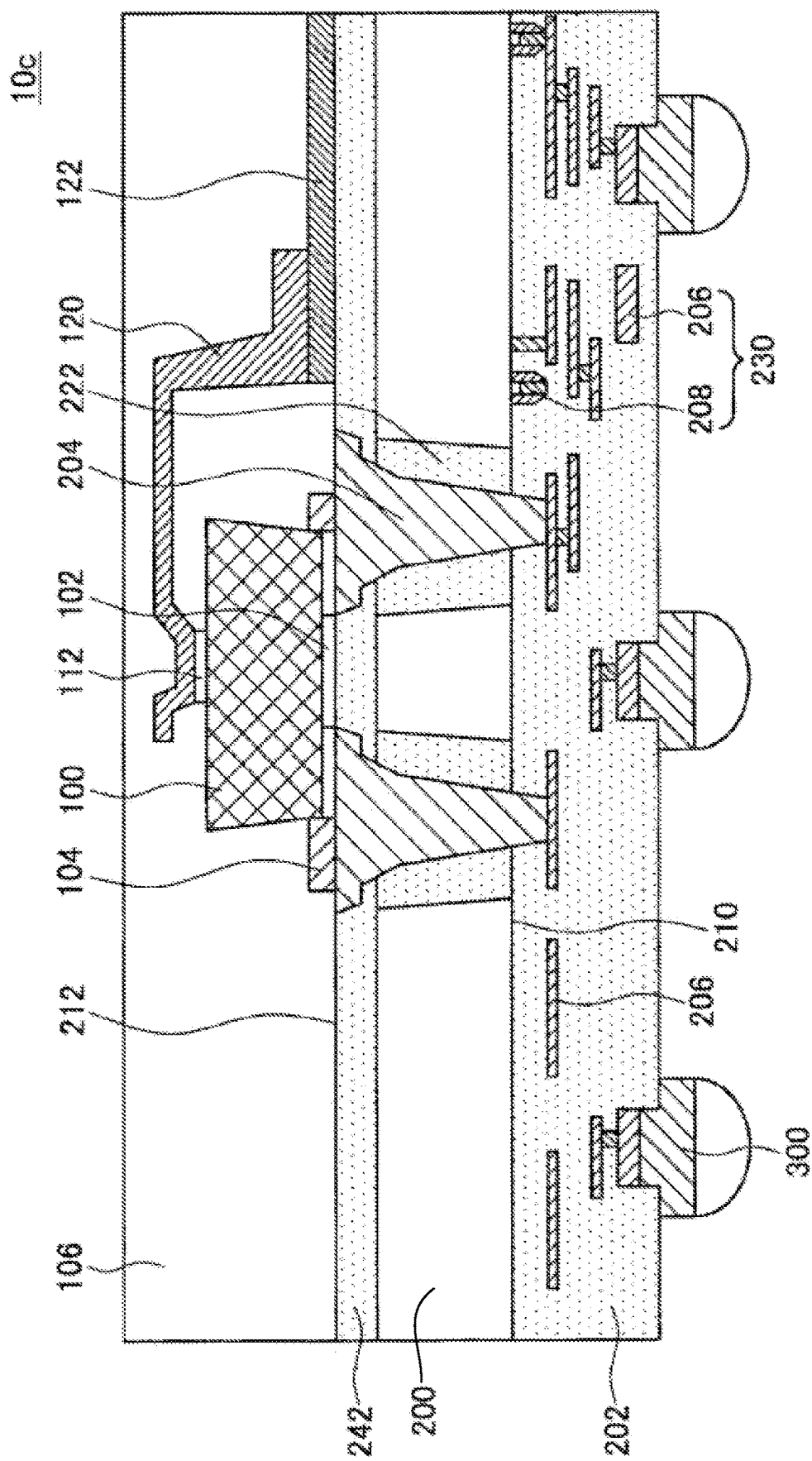
FIG. 17 is a cross-sectional view schematically illustrating a configuration example of a display device 10c according to a fourth embodiment of the present disclosure.

As illustrated in FIG. 17, in the display device (semiconductor device) 10c according to the present embodiment, as with the first embodiment described above, the drive circuit 230 is provided on the front surface 210 (the surface that is positioned on the lower side in FIG. 17) of the semiconductor substrate 200. Further, also in the present embodiment, as with the first embodiment, the insulating layer 242 and the light emitting element 100 are provided on the back surface 212 (the surface that is positioned in the upper side in FIG. 17) side of the semiconductor substrate 200. Then, also in the present embodiment, as with the first embodiment, the through electrode 204 that penetrates the semiconductor substrate 200 from the front surface 210 side to the back surface 212 is provided. The through electrode 204 electrically connects the drive circuit 230 with the light emitting element 100, as has been described above.

Further, in the present embodiment, the light emitting element 100 includes the upper electrode (second electrode) 112 that is provided above the light emitting element 100 (on the upper side in FIG. 17) so as to face the lower electrode 102. Then, as illustrated in FIG. 17, for example, the upper electrode 112 can be electrically connected to an electrode (third electrode) 122 that is provided on the insulating layer 242 on the back surface 212 side of the semiconductor substrate 200 through the wire 120. In addition, in the present embodiment, the upper electrode 122 may be electrically connected to the drive circuit 230 through the through electrode (not illustrated) that penetrates the semiconductor substrate 200.

Note that, in the embodiment of the present disclosure, a mode of the light emitting element 100 is not limited to a mode in which the lower electrode 102 provided below the light emitting element 100 is electrically connected to the drive circuit 230 through the through electrode 204, as illustrated in FIG. 1. In addition, in the embodiment of the present disclosure, the mode of the light emitting element 100 is not limited to a mode in which the upper electrode 112 provided above the light emitting element 100 is electrically connected to the wire 120 which is drawn on the back surface 212 of the semiconductor substrate 200, as illustrated in FIG. 17. In other words, in the embodiment of the present disclosure, a position and a shape of the wire, the electrodes, or the like and a connection method thereof are not particularly limited. Further, in the embodiment of the present disclosure, the mode of the light emitting element 100 may be altered for each color to be emitted, and in other words, in one display device 10, the light emitting elements 100 having various modes may be present in a mixed manner.

6. CONCLUSION

As described above, in the embodiments of the present disclosure, there is provided the through electrode 204 that penetrates the semiconductor substrate 200 and that electrically connects the drive circuit 230 provided on the front surface 210 of the semiconductor substrate 200 with the light emitting element 100 provided on the back surface 212 of the semiconductor substrate 200. According to these embodiments, by using such a through electrode 204 described above, it is possible to reduce the need for leading the wire that electrically connects the drive circuit 230 and the light emitting element 100 in a complicated manner. As a result, according to these embodiments, it is possible to prevent increase in mounting area in which the drive circuit 230 and the light emitting element 100 are mounted and to prevent the manufacturing process of the display device 10 from being more complicated. Further, in these embodiments, since the fine through electrode 204 can also be formed, it becomes possible to achieve miniaturization of the display device 10. In addition, in these embodiments, an interposer substrate is not required, and hence, it is possible to prevent increase in manufacturing costs of the display device 10.

Also, in the embodiments of the present disclosure described above, the semiconductor substrate 200 may not necessarily be a silicon substrate, but be another substrate (for example, SOI (Silicon On Insulator) substrate, an SiGe substrate, or the like).

Moreover, it is possible to carry out the embodiments of the present disclosure described above in combination with one another. For example, by combining the second embodiment and the fourth embodiment described above, the heat dissipation film 400 may be provided on the periphery of the light emitting element 100 including the upper electrode 112. In addition, for example, by combining the third embodiment and the fourth embodiment described above, the light-shielding film 402 may be provided on the periphery of the light emitting element 100 including the upper electrode 112.

Further, in the drawings referred to in the embodiments of the present disclosure described above, for facilitating understanding, individual types of insulating films, insulating layers, and the like may be illustrated in a simplified manner. However, in actual use, these insulating films or the like may be a layered film including a plurality of different insulating materials, and may be a layered film formed in a plurality of different steps.

7. APPLICATION EXAMPLES

Next, with reference to FIGS. 18 to 21, application examples of the display device 10 according to the embodiments of the present disclosure will be described. FIGS. 18 to 21 are external views each illustrating one example of electric equipment to which the display device 10 according to any one of the embodiments of the present disclosure is applicable.

Figure 18:
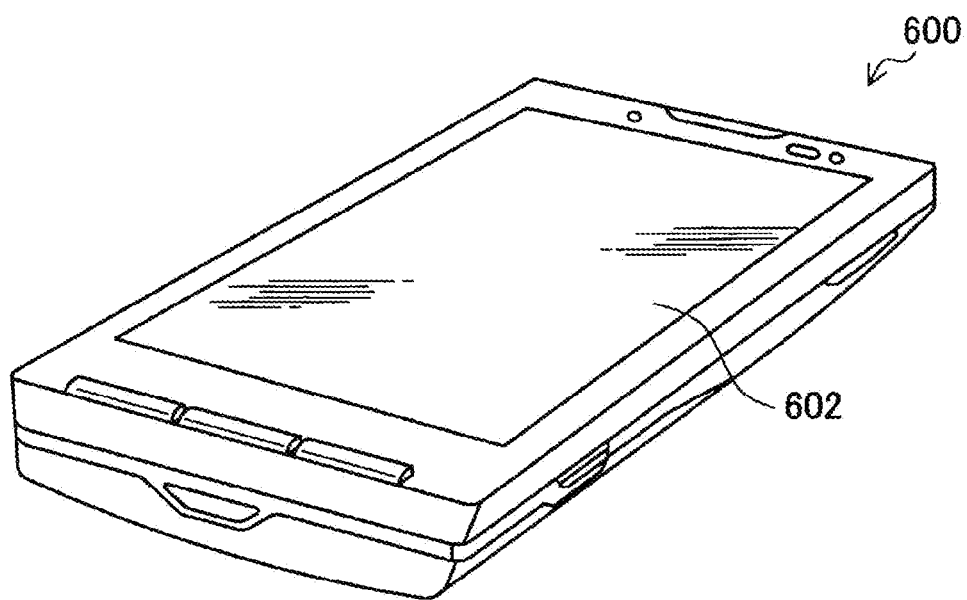
FIG. 18 is an external view illustrating one example of electric equipment to which the display device 10 according to any one of the embodiments of the present disclosure is applicable.

For example, the display device 10 according to the present embodiments can be applied to a display section included in such electronic equipment as a smartphone. Specifically, as illustrated in FIG. 18, a smartphone 600 includes a display section 602 that displays various types of information and an operation unit including buttons and the like for receiving an operation input of the user. The display section 602 can be the display device 10 according to the present embodiments.

Figure 19:
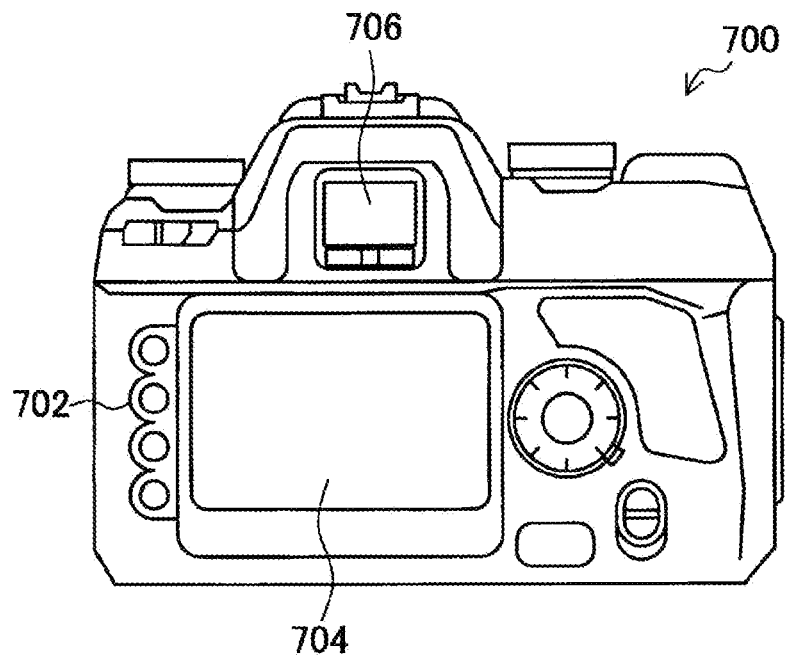
FIG. 19 is an external view illustrating another example of electric equipment to which the display device 10 according to any one of the embodiments of the present disclosure is applicable.

In addition, the display device 10 according to the present embodiments can be applied to, for example, a display section of such electronic equipment as a digital camera. Specifically, as illustrated in FIG. 19 depicting an external view of a digital camera 700 as viewed from the back (photographer side), the digital camera 700 includes a body unit (camera body) 702, a monitor unit 704 that displays various types of information, and an EVF (Electronic View Finder) 706 that displays a through-the-lens image observed by the user during photographing. Here, the monitor unit 704 and the EVF 706 can be the display device 10 according to the present embodiments.

Figure 20:
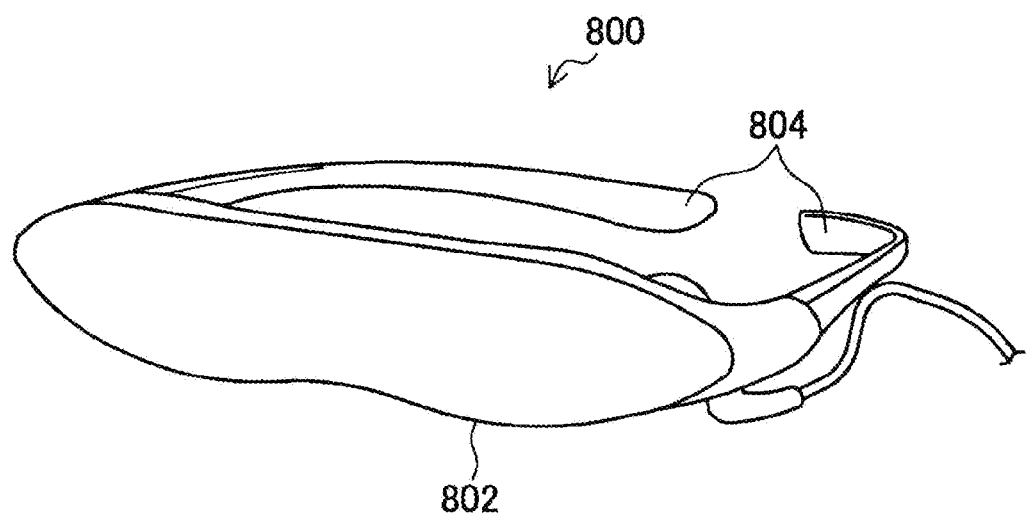
FIG. 20 is an external view illustrating still another example of electric equipment to which the display device 10 according to any one of the embodiments of the present disclosure is applicable.

In addition, for example, the display device 10 according to the present embodiments can be applied to a display section of such electronic equipment as an HMD Head Mounted Display). Specifically, as illustrated in FIG. 20, an HMD 800 includes an eyeglass-type display section 802 that displays various types of information and an ear hook unit 804 hooked on the ears of the user when the user wears the HMD 800. Here, the display section 802 can be the display device 10 according to the present embodiments.

Figure 21:
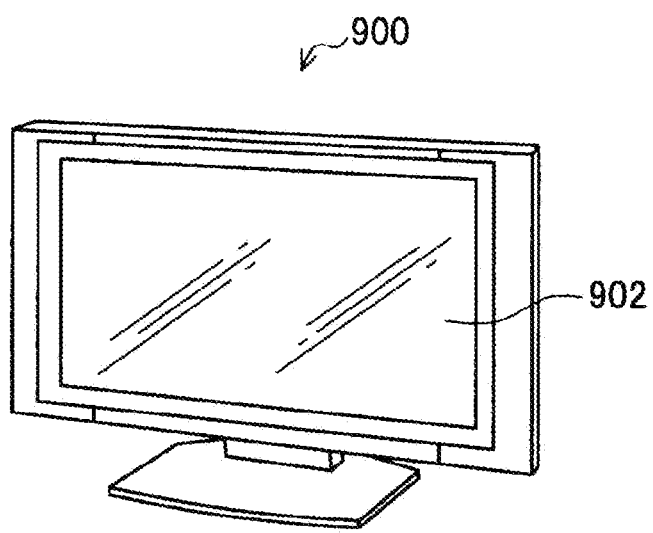
FIG. 21 is an external view illustrating a further example of electric equipment to which the display device 10 according to any one of the embodiments of the present disclosure is applicable.

In addition, for example, the display device 10 according to the present embodiments can be applied to a display section of electronic equipment in a television apparatus or the like. Specifically, as illustrated in FIG. 21, a television apparatus 900 includes a display section 90 that is covered with a filter glass or the like. In this case, the display section 902 can be the display device 10 according to the present embodiments.

Note that the electronic equipment in which the display device 10 according to the present embodiments can be applied is not limited to the examples described above. The display device 10 according to the present embodiments can be applied to a display section of electronic equipment in any field that displays an image, on the basis of an image signal input from the outside or an image signal generated inside. Examples of such electronic equipment include a television apparatus, an electronic book, a PDA (Personal Digital Assistant), a laptop personal computer, a video camera, a smart watch, and a gaming device.

8. SUPPLEMENT

While the preferred embodiments of the present disclosure have been described above in detail with reference to the attached drawings, the technical scope of the present disclosure is not limited to the examples. It is apparent that those with normal knowledge in the technical field of the present disclosure can make various changes or modifications within the scope of the technical idea described in the claims, and it is understood that the changes and the modifications obviously belong to the technical scope of the present disclosure.

In addition, the advantageous effects described in the present specification are explanatory or illustrative only, and are not restrictive. That is, the technique according to the present disclosure can attain other advantageous effects that are apparent to those skilled in the art from the description of the present specification, in addition to or in place of the advantageous effects described above.

Note that the following configuration also belongs to the technical scope of the present disclosure.

(1)

A semiconductor device including:

a drive circuit that is provided on one surface of a semiconductor substrate and drives a light emitting element;

one of or a plurality of the light emitting elements that is provided on another surface of the semiconductor substrate; and a through electrode that penetrates the semiconductor substrate and electrically connects the drive circuit with the light emitting element.

(2)

The semiconductor device according to (1) above, in which the through electrode is electrically connected to a first electrode that is provided on the light emitting element on a side of the semiconductor substrate.

(3)

The semiconductor device according to (2) above, in which the light emitting element further includes a second electrode that faces the first electrode, and the second electrode is electrically connected to a third electrode that is provided on the semiconductor substrate.

(4)

The semiconductor device according to any one of (1) to (3) above, in which a plurality of the light emitting elements is light emitting elements that each emit red light, blue light, or green light.

(5)

The semiconductor device according to any one of (1) to (4) above, in which the through electrode includes a through hole that penetrates the semiconductor substrate, and a metal film that is buried in the through hole.

(6)

The semiconductor device according to any one of (1) to (5) above, further including:
a light-shielding film that is provided on a periphery of the light emitting element on the other surface of the semiconductor substrate.

(7)

The semiconductor device according to any one of (1) to (5) above, further including:
a heat dissipation film that is provided on a periphery of the light emitting element on the other surface of the semiconductor substrate.

(8)

The semiconductor device according to (7) above, further including:
another through electrode that penetrates the semiconductor substrate and connects the heat dissipation film with the one surface of the semiconductor substrate.

(9)

The semiconductor device according to any one of (1) to (8) above, in which
the light emitting element is covered with a transparent resin.

(10)

The semiconductor device according to any one of (1) to (9) above, in which
the drive circuit is covered with an insulating film, and
a bump for electrically connecting another substrate is provided on the insulating film.

(11)

Electronic equipment including:
one or a plurality of semiconductor devices including
a drive circuit that is provided on one surface of a semiconductor substrate and drives a light emitting element,
one of or a plurality of the light emitting elements that is provided on another surface of the semiconductor substrate, and
a through electrode that penetrates the semiconductor substrate and electrically connects the drive circuit with the light emitting element.

REFERENCE SIGNS LIST 10, 10a, 10b, 10c: Semiconductor device
100: Light emitting element
102: Lower electrode
104: Contact
106: Transparent resin layer
112: Upper electrode
120, 206: Wire
122, 302: Electrode
200: Semiconductor substrate
202, 242: Insulating layer
204, 204c: Through electrode
204a: Through hole
204b: Metal film
208: Transistor
210: Front surface
212: Back surface
222: Insulating film
230: Drive circuit
250: Semiconductor layer
300: Bump
400: Heat dissipation film
402: Light-shielding film
500, 508: Support substrate
514: Trench
506: Resin layer
510: Photoresist
600: Smartphone
602, 802, 902: Display section
700: Digital camera
702: Body unit
704: Monitor unit
706: EVF
800: HMD
804: Ear hook unit
900: Television apparatus

The invention claimed is:

1. A semiconductor device, comprising:
a first semiconductor substrate;
a light emitting element on a first surface of the first semiconductor substrate;
a drive circuit on a second surface of the first semiconductor substrate, wherein the drive circuit is configured to drive the light emitting element;
a first through electrode and a second through electrode that penetrate the first semiconductor substrate, wherein
the first through electrode and the second through electrode electrically connect the drive circuit with the light emitting element, and
the light emitting element on the first surface of the first semiconductor substrate straddles the first through electrode and the second through electrode that penetrate the first semiconductor substrate;
a first electrode on a first side of the light emitting element, wherein
the first through electrode and the second through electrode are electrically connected to the first electrode, and
the first electrode is on the first surface of the first semiconductor substrate;
a second electrode on a second side of the light emitting element, wherein the first electrode faces the second electrode; and
a third electrode on the first surface of the first semiconductor substrate, wherein the second electrode is electrically connected to the third electrode.

2. The semiconductor device according to claim 1, wherein the light emitting element is configured to emit at least one of a red light, a blue light, or a green light.

3. The semiconductor device according to claim 1, wherein
each of the first through electrode and the second through electrode includes:
a through hole that penetrates the first semiconductor substrate, and
a metal film that is buried in the through hole.

4. The semiconductor device according to claim 1, further comprising
a light-shielding film on a periphery of the light emitting element on the first surface of the first semiconductor substrate.

5. The semiconductor device according to claim 1, further comprising
a heat dissipation film on a periphery of the light emitting element on the first surface of the first semiconductor substrate.

6. The semiconductor device according to claim 5, further comprising:
a third through electrode that penetrates the first semiconductor substrate and connects the heat dissipation film with the second surface of the first semiconductor substrate.

7. The semiconductor device according to claim 1, further comprising
a transparent resin that covers the light emitting element.

8. The semiconductor device according to claim 1, wherein
the drive circuit includes:
a plurality of transistors; and
a plurality of wires, wherein
the plurality of transistors and the plurality of wires are covered with an insulating film, and
a bump that electrically connects a second semiconductor substrate is on a first side of the insulating film far from the first semiconductor substrate.

9. An electronic equipment, comprising:
one or more semiconductor devices including:
a first semiconductor substrate;
a light emitting element on a first surface of the first semiconductor substrate;
a drive circuit on a second surface of the first semiconductor substrate, wherein the drive circuit is configured to drive the emitting element;
and
a first through electrode and a second through electrode that penetrate the first semiconductor substrate, wherein
the first through electrode and the second through electrode electrically connect the drive circuit with the light emitting element, and
the light emitting element on the first surface of the first semiconductor substrate straddles the first through electrode and the second through electrode that penetrate the first semiconductor substrate;
a first electrode on a first side of the light emitting element, wherein
the first through electrode and the second through electrode are electrically connected to the first electrode, and
the first electrode is on the first surface of the first semiconductor substrate;
a second electrode on a second side of the light emitting element, wherein the first electrode faces the second electrode; and
a third electrode on the first surface of the first semiconductor substrate, wherein the second electrode is electrically connected to the third electrode.

* * * * *